US009438193B2

(12) United States Patent
Dizon et al.

(10) Patent No.: US 9,438,193 B2
(45) Date of Patent: Sep. 6, 2016

(54) SATELLITE VOLUME CONTROL

(71) Applicant: Sonos, Inc., Santa Barbara, CA (US)

(72) Inventors: Bob Dizon, Cambridge, MA (US); Neil Griffiths, Cambridge, MA (US); Luis R Vega-Zayas, Cambridge, MA (US)

(73) Assignee: Sonos, Inc., Santa Barbara, CA (US)

( * ) Notice: Subject to any disclaimer, the term of this patent is extended or adjusted under 35 U.S.C. 154(b) by 286 days.

(21) Appl. No.: 13/910,608

(22) Filed: Jun. 5, 2013

(65) Prior Publication Data

US 2014/0363022 A1    Dec. 11, 2014

(51) Int. Cl.
*H03G 3/00* (2006.01)
*H03G 3/30* (2006.01)
(Continued)

(52) U.S. Cl.
CPC .......... *H03G 3/3089* (2013.01); *H03G 3/3005* (2013.01); *H04L 12/282* (2013.01); *H04N 5/44582* (2013.01); *H04N 21/43615* (2013.01); *H04R 2420/07* (2013.01)

(58) Field of Classification Search
CPC .... H03G 3/3089; H03G 3/3005; H03G 1/02; H03G 3/20; H03G 3/00; H03G 7/00; H04R 2420/07; H04R 3/12; H04L 12/12; H04L 12/16; H04L 12/282; H04L 12/2838; H04L 2012/2841; H04L 2012/2849; H04L 65/1093; H04L 65/1059; H04L 69/28; H04L 65/60; H04L 65/80; H04L 67/1095; H04L 67/26; H04L 67/025; G06F 15/16; G06F 17/00; G06F 3/048; G06F 3/165; G06F 3/16; G06F 3/0484; G06F 3/167; G06F 3/0482; G06F 1/00; G06F 17/3074; G06F 17/30017; H04J 3/0664; G05B 15/02; H04N 21/43615; H04N 21/42684; H04N 5/44582
USPC ............ 381/77, 79, 81, 104, 105, 107, 300; 709/248, 203, 217, 218, 219; 700/94; 370/338; 455/3.06, 3.01, 3.03
See application file for complete search history.

(56) References Cited

U.S. PATENT DOCUMENTS 5,182,552 A    1/1993    Paynting
5,239,458 A    8/1993    Suzuki
(Continued)

FOREIGN PATENT DOCUMENTS

WO    0153994    7/2001
WO    2005013047 A2    2/2005

OTHER PUBLICATIONS

Bluetooth, "Specification of the Bluetooth System: The Ad Hoc SCATTERNET for Affordable and Highly Functional Wireless Connectivity," Core, Version 1.0 A, Jul. 26, 1999 (1068 pages). (Document uploaded in 7 different files: NPL1_part1 pp. 1 to 150, NPL1_part2 pp. 151 to 300, NPL1_part3 pp. 301 to 450, NPL1_part4 pp. 451 to 600,NPL1_part5 pp. 601 to 750, NPL1_part6 pp. 751 to 900 and NPL1_part7 pp. 901 to 1068).
(Continued)

*Primary Examiner* — Vivian Chin
*Assistant Examiner* — Ubachukwu Odunukwe
(74) *Attorney, Agent, or Firm* — McDonnell, Boehnen, Hulbert & Berghoff LLP

(57) ABSTRACT

Embodiments are provided for satellite volume control. An example method includes receiving an input at a playback device to adjust a volume for a plurality of playback devices that are grouped for synchronous playback of audio content, wherein the plurality of playback devices includes the playback device. The method also includes sending a first message over a network from the playback device to a device associated with the plurality of playback devices, the first message including information based on the input, wherein the information is used to adjust the volume of the plurality of playback devices. The method also includes receiving a second message at the playback device over the network, the second message including information for the volume of the playback device, wherein the volume is based on the adjusted volume of the plurality of playback devices.

20 Claims, 14 Drawing Sheets

(51) Int. Cl.
 *H04N 5/445* (2011.01)
 *H04N 21/436* (2011.01)
 *H04L 12/28* (2006.01)

(56) References Cited

U.S. PATENT DOCUMENTS

| | | | |
|---|---|---|---|
| 5,299,266 | A | 3/1994 | Lumsden |
| 5,406,634 | A | 4/1995 | Anderson et al. |
| 5,440,644 | A | 8/1995 | Farinelli et al. |
| 5,751,819 | A | 5/1998 | Dorrough |
| 5,923,902 | A | 7/1999 | Inagaki |
| 6,026,150 | A | 2/2000 | Frank et al. |
| 6,256,554 | B1 | 7/2001 | DiLorenzo |
| 6,404,811 | B1 | 6/2002 | Cvetko et al. |
| 6,430,353 | B1 | 8/2002 | Honda et al. |
| 6,487,296 | B1 | 11/2002 | Allen et al. |
| 6,522,886 | B1 | 2/2003 | Youngs et al. |
| 6,611,537 | B1 | 8/2003 | Edens et al. |
| 6,631,410 | B1 | 10/2003 | Kowalski et al. |
| 6,728,531 | B1 | 4/2004 | Lee et al. |
| 6,757,517 | B2 | 6/2004 | Chang |
| 6,778,869 | B2 | 8/2004 | Champion |
| 6,826,283 | B1 | 11/2004 | Wheeler et al. |
| 6,996,837 | B1 | 2/2006 | Miura et al. |
| 7,130,608 | B2 | 10/2006 | Hollström et al. |
| 7,130,616 | B2 | 10/2006 | Janik |
| 7,143,939 | B2 | 12/2006 | Henzerling |
| 7,218,708 | B2 | 5/2007 | Berezowski et al. |
| 7,236,773 | B2 | 6/2007 | Thomas |
| 7,312,785 | B2 | 12/2007 | Tsuk et al. |
| 7,319,764 | B1 | 1/2008 | Reid et al. |
| 7,483,538 | B2 | 1/2009 | McCarty et al. |
| 7,571,014 | B1 | 8/2009 | Lambourne et al. |
| 7,643,894 | B2 | 1/2010 | Braithwaite et al. |
| 7,657,910 | B1 | 2/2010 | McAulay et al. |
| 7,668,990 | B2 | 2/2010 | Krzyzanowski et al. |
| 7,672,470 | B2 | 3/2010 | Lee |
| 7,742,740 | B2 | 6/2010 | Goldberg et al. |
| 7,853,341 | B2 | 12/2010 | McCarty et al. |
| 8,014,423 | B2 | 9/2011 | Thaler et al. |
| 8,045,952 | B2 | 10/2011 | Qureshey et al. |
| 8,050,203 | B2 | 11/2011 | Jacobsen et al. |
| 8,050,652 | B2 | 11/2011 | Qureshey et al. |
| 8,103,009 | B2 | 1/2012 | McCarty et al. |
| 8,131,390 | B2 | 3/2012 | Braithwaite et al. |
| 8,218,790 | B2 | 7/2012 | Bull et al. |
| 8,234,395 | B2 | 7/2012 | Millington |
| 8,290,603 | B1 | 10/2012 | Lambourne |
| 8,316,154 | B2 * | 11/2012 | Yoneda ................ H04L 12/282 709/203 |
| 8,611,559 | B2 | 12/2013 | Sanders |
| 8,885,851 | B2 | 11/2014 | Westenbroek |
| 8,917,877 | B2 | 12/2014 | Haff et al. |
| 2001/0042107 | A1 | 11/2001 | Palm |
| 2002/0003548 | A1 | 1/2002 | Krusche et al. |
| 2002/0022453 | A1 | 2/2002 | Balog et al. |
| 2002/0026442 | A1 | 2/2002 | Lipscomb et al. |
| 2002/0109710 | A1 | 8/2002 | Holtz et al. |
| 2002/0124097 | A1 | 9/2002 | Isely et al. |
| 2002/0165921 | A1 | 11/2002 | Sapieyevski |
| 2002/0188762 | A1 | 12/2002 | Tomassetti et al. |
| 2003/0020763 | A1 | 1/2003 | Mayer, III et al. |
| 2003/0023741 | A1 | 1/2003 | Tomassetti et al. |
| 2003/0157951 | A1 | 8/2003 | Hasty, Jr. |
| 2003/0210796 | A1 | 11/2003 | McCarty et al. |
| 2004/0008852 | A1 | 1/2004 | Also et al. |
| 2004/0010727 | A1 | 1/2004 | Fujinami |
| 2004/0015252 | A1 | 1/2004 | Aiso et al. |
| 2004/0024478 | A1 | 2/2004 | Hans et al. |
| 2004/0131192 | A1 | 7/2004 | Metcalf |
| 2005/0047605 | A1 | 3/2005 | Lee et al. |
| 2005/0289224 | A1 | 12/2005 | Deslippe et al. |
| 2007/0038999 | A1 | 2/2007 | Millington |
| 2007/0142022 | A1 | 6/2007 | Madonna et al. |
| 2007/0142944 | A1 | 6/2007 | Goldberg et al. |
| 2008/0118086 | A1 | 5/2008 | Krig |
| 2008/0242222 | A1 * | 10/2008 | Bryce ................ H04L 12/2809 455/3.06 |
| 2009/0228919 | A1 | 9/2009 | Zott et al. |
| 2010/0142723 | A1 * | 6/2010 | Bucklen ................ H04R 3/02 381/81 |
| 2010/0284389 | A1 * | 11/2010 | Ramsay ............ G06F 17/30017 370/338 |
| 2012/0051560 | A1 | 3/2012 | Sanders |
| 2012/0057725 | A1 | 3/2012 | Nakamura |
| 2012/0120207 | A1 | 5/2012 | Shimazaki et al. |
| 2012/0192071 | A1 | 7/2012 | Millington |
| 2013/0014015 | A1 | 1/2013 | Lambourne |
| 2013/0016858 | A1 * | 1/2013 | Masaki ............ H04N 21/4126 381/104 |
| 2013/0076651 | A1 | 3/2013 | Reimann et al. |
| 2013/0080955 | A1 | 3/2013 | Reimann et al. |
| 2013/0094667 | A1 * | 4/2013 | Millington ............ H04L 12/28 381/104 |
| 2013/0094670 | A1 * | 4/2013 | Millington ............ H04J 3/0664 381/107 |
| 2013/0287228 | A1 * | 10/2013 | Kallai ................ H04R 3/14 381/107 |
| 2013/0338804 | A1 * | 12/2013 | Sheen ................ G08C 23/04 700/94 |
| 2014/0037107 | A1 * | 2/2014 | Marino, Jr. ............ H03G 3/10 381/107 |
| 2014/0075311 | A1 | 3/2014 | Boettcher et al. |
| 2014/0093085 | A1 * | 4/2014 | Jarvis ................ H04R 27/00 381/17 |

OTHER PUBLICATIONS

Bluetooth, "Specification of the Bluetooth System: Wireless Connections Made Easy," Core, Version 1.0 B, Dec. 1, 1999 (1082 pages). (Document uploaded in 9 different files: NPL2_part1 pp. 1 to 152, NPL2_part2 pp. 153 to 303, NPL2_part3 pp. 304 to 453, NPL2_part4 pp. 454 to 603,NPL2_part5 pp. 604 to 704, NPL2_part6 pp. 705 to 753, NPL2_part7 pp. 754 to 854, NPL2_part8 pp. 855-1005 and NPL2_part9 pp. 1006-1081).

Dell Computer Corporation, "Dell Digital Audio Receiver: Reference Guide," Jun. 2000 (70 pages).

Dell Computer Corporation, "Dell Digital Audio Receiver: Start Here," Jun. 2000 (2 pages).

Jo et al., "Synchronized One-to-Many Media Streaming with Adaptive Playout Control," Proceedings of SPIE, vol. 4861, Dec. 2002 (11 pages).

Jones, Stephen, "Dell Digital Audio Receiver: Digital Upgrade for your Analog Stereo," Reviews Online, Jun. 24, 2000, retrieved from <http://www.reviewsonline.com/articles/961906864.htm>, retrieved on Jun. 18, 2014 (2 pages).

Louderback, Jim, "Affordable Audio Receiver Furnishes Homes With MP3," TechTV Vault, Jun. 28, 2000, retrieved from <http://www.g4tv.com/articles/17923/affordable-audio-receiver-furnishes-homes-with-mp3/>, retrieved on Jul. 10, 2014 (2 pages).

Palm, Inc., "Handbook for the Palm VII Handheld," May 19, 2000 (311 pages). (Document uploaded in 2 different files: NPL8_part1 pp. 1 to 150 and NPL8_part2 pp. 151 to 300).

Higgins et al., Microsoft Corporation, "Presentations at WinHEC 2000", May 2000 (138 pages).

"AudioTron Quick Start Guide, Version 1.0," Voyetra Turtle Beach, Inc., Mar. 2001, 24 pages.

"AudioTron Reference Manual, Version 3.0," Voyetra Turtle Beach, Inc., May 2002, 70 pages.

"AudioTron Setup Guide, Version 3.0," Voyetra Turtle Beach, Inc., May 2002, 38 pages.

"Simplefi, Wireless Digital Audio Receiver, Installation and User Guide," Motorola Inc., 2001, 111 pages.

"Polycom Conference Composer User Guide," Polycom, Inc., 2001, 29 pages.

"PRISMIQ MediaPlayer User Guide," PRISMIQ, Inc., 2003, 44 pages.

(56) References Cited

OTHER PUBLICATIONS

"Universal Plug and Play Device Architecture," Microsoft Corporation, Version 1.0, Jun. 8, 2000, 54 pages.
"DME 32—Owner's Manual," Yamaha Corporation, 2000, 296 pages.
International Searching Authority, "International Search Report and Written Opinion," issued in connection with corresponding International Patent Application No. PCT/US2014/040891, mailed Oct. 2, 2014 (11 pages).
European Patent Office, European Extended Search Report mailed on May 23, 2016, issued in connection with Application No. 14808039.3-1810, 10 pages.

* cited by examiner

SATELLITE VOLUME CONTROL

FIELD OF THE DISCLOSURE

The disclosure is related to consumer goods and, more particularly, to methods, systems, products, features, services, and other items directed to media playback or some aspect thereof.

BACKGROUND

Digital music has become readily available due in part to the development of consumer level technology that has allowed people to listen to digital music on a personal audio device. The consumer's increasing preference for digital audio has also resulted in the integration of personal audio devices into PDAs, cellular phones, and other mobile devices. The portability of these mobile devices has enabled people to take the music listening experience with them and outside of the home. People have become able to consume digital music, like digital music files or even Internet radio, in the home through the use of their computer or similar devices. Now there are many different ways to consume digital music, in addition to other digital content including digital video and photos, stimulated in many ways by high-speed Internet access at home, mobile broadband Internet access, and the consumer's hunger for digital media.

Until recently, options for accessing and listening to digital audio in an out-loud setting were severely limited. In 2005, Sonos offered for sale its first digital audio system that enabled people to, among many other things, access virtually unlimited sources of audio via one or more networked connected zone players, dynamically group or ungroup zone players upon command, wirelessly send the audio over a local network amongst zone players, and play the digital audio out loud in synchrony. The Sonos system can be controlled by software applications downloaded to certain network capable, mobile devices and computers.

Given the insatiable appetite of consumers towards digital media, there continues to be a need to develop consumer technology that revolutionizes the way people access and consume digital media.

BRIEF DESCRIPTION OF THE DRAWINGS

Features, aspects, and advantages of the presently disclosed technology may be better understood with regard to the following description, appended claims, and accompanying drawings where:

Figure 1:
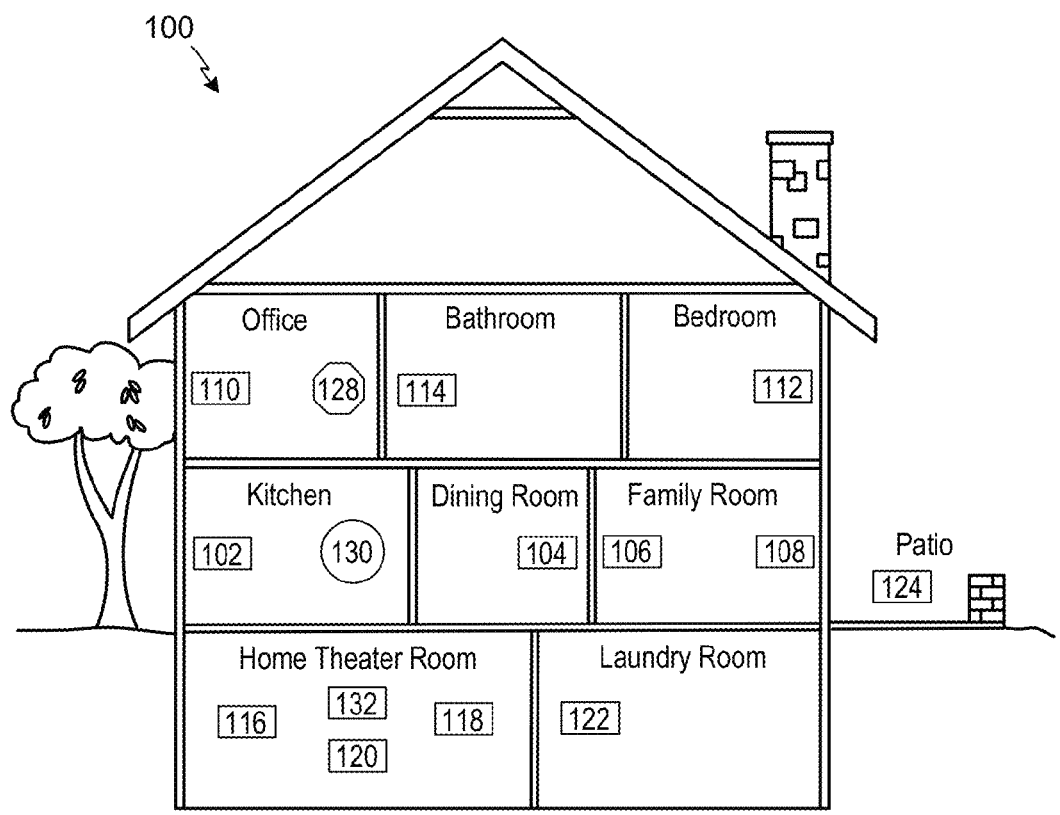
FIG. 1 shows an example configuration in which certain embodiments may be practiced.

In addition, the drawings are for the purpose of illustrating example embodiments, but it is understood that the inventions are not limited to the arrangements and instrumentality shown in the drawings.

DETAILED DESCRIPTION

I. Overview

Embodiments disclosed herein enable satellite volume control for a plurality of playback devices that are grouped for synchronous playback of audio content. In some embodiments, the plurality of playback devices includes a primary playback device and one or more secondary (or satellite) playback devices. In some embodiments, the group of playback devices may behave in a synchronized fashion (e.g., a bonded zone). That is, the playback devices included in the bonded zone may play the same or different channels of an audio signal such that the playback devices play back information from the audio signal with no (or substantially no) audible delays or hiccups. In some embodiments, input (e.g., user input) received at any one playback device of the bonded zone applies to the plurality of playback devices forming the bonded zone. Unlike prior systems, embodiments disclosed herein enable a volume change request received at a secondary playback device in a bonded zone to be propagated throughout the bonded zone such that audio content heard from the playback devices of the bonded zone corresponds to the requested volume change rather than only at the secondary playback device.

Other embodiments, as those discussed in the following and others as can be appreciated by one having ordinary skill in the art are also possible.

II. Example Operating Environment

Referring now to the drawings, in which like numerals can refer to like parts throughout the figures, FIG. 1 shows an example media system configuration 100 in which one or more embodiments disclosed herein can be practiced or implemented.

By way of illustration, the media system configuration 100 is associated with a home having multiple zones, though the home could have been configured with only one zone. Additionally, one or more zones can be added over time. Each zone may be assigned by a user to a different room or space, such as, for example, an office, bathroom, bedroom, kitchen, dining room, family room, home theater room, utility or laundry room, and patio. A single zone might also include multiple rooms or spaces if so configured. With respect to FIG. 1, one or more of zone players 102-124 are shown in each respective zone. A zone player 102-124, also referred to herein as a playback device, multimedia unit, speaker, player, and so on, provides audio, video, and/or audiovisual output. A controller 130 (e.g., shown in the kitchen for purposes of this illustration) provides control to the media system configuration 100. Controller 130 may be fixed to a zone, or alternatively, mobile such that it can be moved about the zones. The media system configuration 100 may also include more than one controller 130, and additional controllers may be added to the system over time.

The media system configuration 100 illustrates an example whole house media system, though it is understood that the technology described herein is not limited to, among other things, its particular place of application or to an expansive system like a whole house media system 100 of FIG. 1.

a. Example Zone Players

Figure 2A:
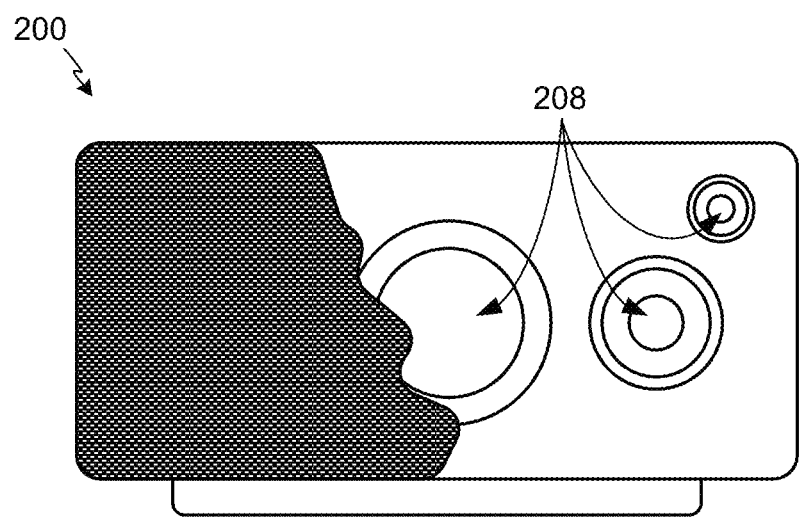
FIG. 2A shows an illustration of an example zone player having a built-in amplifier and transducers.
Figure 2B:
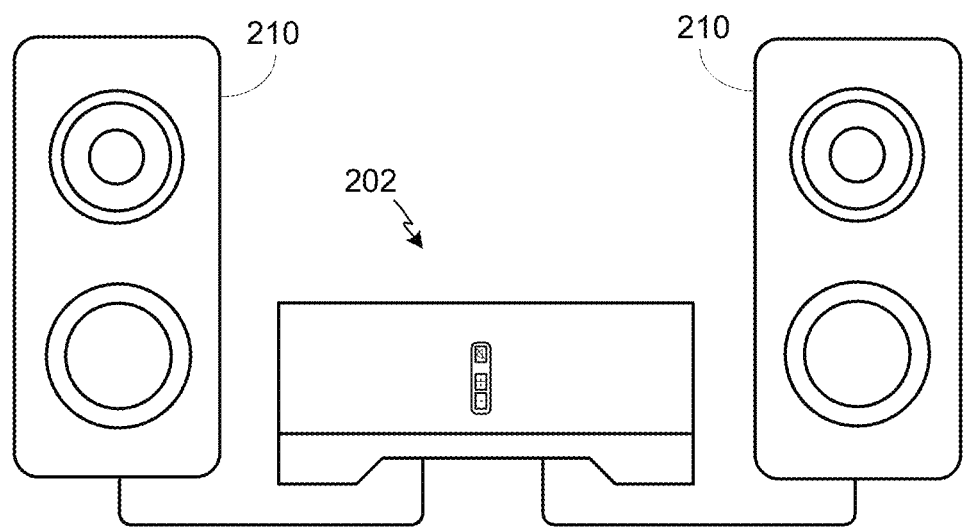
FIG. 2B shows an illustration of an example zone player having a built-in amplifier and connected to external speakers.
Figure 2C:
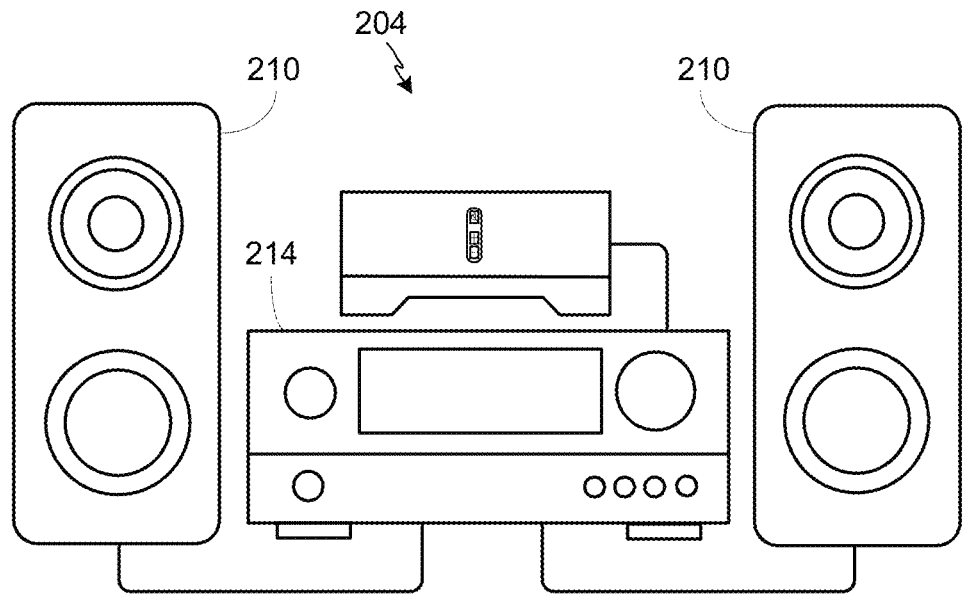
FIG. 2C shows an illustration of an example zone player connected to an A/V receiver and speakers.

FIGS. 2A, 2B, and 2C show example types of zone players. Zone players 200, 202, and 204 of FIGS. 2A, 2B, and 2C, respectively, can correspond to any of the zone players 102-124 of FIG. 1, for example. In some embodiments, audio is reproduced using only a single zone player, such as by a full-range player. In some embodiments, audio is reproduced using two or more zone players, such as by using a combination of full-range players or a combination of full-range and specialized players. In some embodiments, zone players 200-204 may also be referred to as a "smart speaker," because they contain processing capabilities beyond the reproduction of audio, more of which is described below.

FIG. 2A illustrates zone player 200 that includes sound producing equipment 208 capable of reproducing full-range sound. The sound may come from an audio signal that is received and processed by zone player 200 over a wired or wireless data network. Sound producing equipment 208 includes one or more built-in amplifiers and one or more acoustic transducers (e.g., speakers). A built-in amplifier is described more below with respect to FIG. 4. A speaker or acoustic transducer can include, for example, any of a tweeter, a mid-range driver, a low-range driver, and a subwoofer. In some embodiments, zone player 200 can be statically or dynamically configured to play stereophonic audio, monaural audio, or both. In some embodiments, zone player 200 may be dynamically configured to reproduce a subset of full-range sound, such as when zone player 200 is grouped with other zone players to play stereophonic audio, monaural audio, and/or surround audio or when the audio content received by zone player 200 is less than full-range.

FIG. 2B illustrates zone player 202 that includes a built-in amplifier to power a set of detached speakers 210. A detached speaker can include, for example, any type of loudspeaker. Zone player 202 may be configured to power one, two, or more separate loudspeakers. Zone player 202 may be configured to communicate an audio signal (e.g., right and left channel audio or more channels depending on its configuration) to the detached speakers 210 via a wired path.

FIG. 2C illustrates zone player 204 that does not include a built-in amplifier, but is configured to communicate an audio signal, received over a data network, to an audio (or "audio/video") receiver 214 with built-in amplification.

Referring back to FIG. 1, in some embodiments, one, some, or all of the zone players 102 to 124 can retrieve audio directly from a source. For example, a particular zone player in a zone or zone group may be assigned to a playback queue (or "queue"). The playback queue contains information corresponding to zero or more audio items for playback by the associated zone or zone group. The playback queue may be stored in memory on a zone player or some other designated device. Each item contained in the playback queue may comprise a uniform resource identifier (URI) or some other identifier that can be used by the zone player(s) to seek out and/or retrieve the audio items from the identified audio source(s). Depending on the item, the audio source might be found on the Internet (e.g., the cloud), locally from another device over the data network 128 (described further below), from the controller 130, stored on the zone player itself, or from an audio source communicating directly to the zone player. In some embodiments, the zone player can reproduce the audio itself (e.g., play the audio), send the audio to another zone player for reproduction, or both where the audio is reproduced by the zone player as well as one or more additional zone players (possibly in synchrony). In some embodiments, the zone player may play a first audio content (or alternatively, may not play the content at all), while sending a second, different audio content to another zone player(s) for reproduction. To the user, each item in a playback queue is represented on an interface of a controller by an element such as a track name, album name, playlist, or other some other representation. A user can populate the playback queue with audio items of interest. The user may also modify and clear the playback queue, if so desired.

By way of illustration, SONOS, Inc. of Santa Barbara, Calif. presently offers for sale zone players referred to as a "PLAY:5," "PLAY:3," "PLAYBAR," "CONNECT:AMP," "CONNECT," and "SUB." Any other past, present, and/or future zone players can additionally or alternatively be used to implement the zone players of example embodiments disclosed herein. Additionally, it is understood that a zone player is not limited to the particular examples illustrated in FIGS. 2A, 2B, and 2C or to the SONOS product offerings. For example, a zone player may include a wired or wireless headphone. In yet another example, a zone player might include a sound bar for television. In yet another example, a zone player may include or interact with a docking station for an Apple IPOD™ or similar device.

b. Example Controllers

Figure 3:
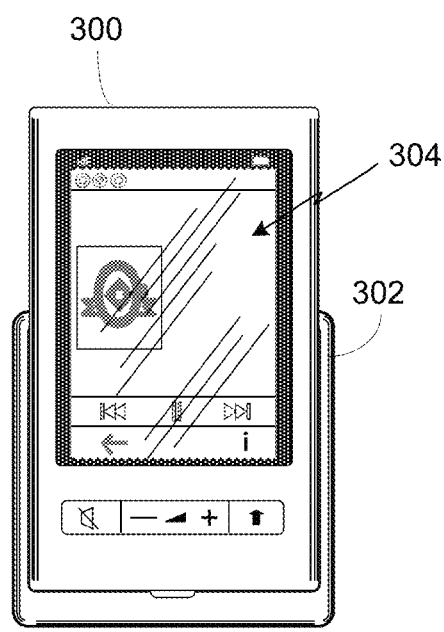
FIG. 3 shows an illustration of an example controller.

FIG. 3 illustrates an example wireless controller 300 in docking station 302. By way of illustration, controller 300 may correspond to controlling device 130 of FIG. 1. Docking station 302, if provided or used, may provide power to the controller 300 and additionally may charge a battery of controller 300. In some embodiments, controller 300 may be provided with a touch screen 304 that allows a user to interact through touch with the controller 300, for example, to retrieve and navigate a playlist of audio items, control operations of one or more zone players, and provide overall control of the system configuration 100. In other embodiments, other input mechanisms such as voice control may be used to interact with the controller 300. In certain embodiments, any number of controllers can be used to control the system configuration 100. In some embodiments, there may be a limit set on the number of controllers that can control the system configuration 100. The controllers might be wireless like wireless controller 300 or wired to data network 128.

In some embodiments, if more than one controller is used in system 100 of FIG. 1, each controller may be coordinated to display common content, and may all be dynamically updated to indicate changes made to the system 100 from a single controller. Coordination can occur, for instance, by a controller periodically requesting a state variable directly or indirectly from one or more of the zone players; the state variable may provide information about system 100, such as current zone group configuration, what is playing in one or more zones, volume levels, and other items of interest. The state variable may be passed around on data network 128 between zone players (and controllers, if so desired) as needed or as often as programmed.

In addition, an application running on any network-enabled portable device, such as an IPHONE™, IPAD™, ANDROID™ powered phone or tablet, or any other smart phone or network-enabled device can be used as controller 130. An application running on a laptop or desktop personal computer (PC) or Mac™ can also be used as controller 130. Such controllers may connect to system 100 through an interface with data network 128, a zone player, a wireless router, or using some other configured connection path. Example controllers offered by Sonos, Inc. of Santa Barbara, Calif. include a "Controller 200," "SONOS® CONTROL," "SONOS® Controller for IPHONE™," "SONOS® Controller for IPAD™," "SONOS® Controller for ANDROID™," "SONOS® Controller for MAC™ or PC."

c. Example Data Connection

Zone players 102 to 124 of FIG. 1 are coupled directly or indirectly to a data network, such as data network 128. Controller 130 may also be coupled directly or indirectly to data network 128 or individual zone players. Data network 128 is represented by an octagon in the figure to stand out from other representative components. While data network 128 is shown in a single location, it is understood that such a network is distributed in and around system 100. Particularly, data network 128 can be a wired network, a wireless network, or a combination of both wired and wireless networks. In some embodiments, one or more of the zone players 102-124 are wirelessly coupled to data network 128 based on a proprietary mesh network. In some embodiments, one or more of the zone players are coupled to data network 128 using a centralized access point such as a wired or wireless router. In some embodiments, one or more of the zone players 102-124 are coupled via a wire to data network 128 using Ethernet or similar technology. In addition to the one or more zone players 102-124 connecting to data network 128, data network 128 can further allow access to a wide area network, such as the Internet.

In some embodiments, connecting any of the zone players 102-124, or some other connecting device, to a broadband router, can create data network 128. Other zone players 102-124 can then be added wired or wirelessly to the data network 128. For example, a zone player (e.g., any of zone players 102-124) can be added to the system configuration 100 by simply pressing a button on the zone player itself (or perform some other action), which enables a connection to be made to data network 128. The broadband router can be connected to an Internet Service Provider (ISP), for example. The broadband router can be used to form another data network within the system configuration 100, which can be used in other applications (e.g., web surfing). Data network 128 can also be used in other applications, if so programmed. An example, second network may implement SONOSNET™ protocol, developed by SONOS, Inc. of Santa Barbara. SONOSNET™ represents a secure, AES-encrypted, peer-to-peer wireless mesh network. Alternatively, in certain embodiments, the data network 128 is the same network, such as a traditional wired or wireless network, used for other applications in the household.

d. Example Zone Configurations

A particular zone can contain one or more zone players. For example, the family room of FIG. 1 contains two zone players 106 and 108, while the kitchen is shown with one zone player 102. In another example, the home theater room contains additional zone players to play audio from a 5.1 channel or greater audio source (e.g., a movie encoded with 5.1 or greater audio channels). In some embodiments, one can position a zone player in a room or space and assign the zone player to a new or existing zone via controller 130. As such, zones may be created, combined with another zone, removed, and given a specific name (e.g., "Kitchen"), if so desired and programmed to do so with controller 130. Moreover, in some embodiments, zone configurations may be dynamically changed even after being configured using controller 130 or some other mechanism.

In some embodiments, a "bonded zone" is a zone that contains two or more zone players, such as the two zone players 106 and 108 in the family room, whereby the two zone players 106 and 108 can be configured to play the same audio source in synchrony. In one example, the two zone players 106 and 108 can be paired to play two separate sounds in left and right channels, for example. In other words, the stereo effects of a sound can be reproduced or enhanced through the two zone players 106 and 108, one for the left sound and the other for the right sound. In another example two or more zone players can be sonically consolidated to form a single, consolidated zone player. A consolidated zone player (though made up of multiple, separate devices) can be configured to process and reproduce sound differently than an unconsolidated zone player or zone players that are paired, because a consolidated zone player has additional speaker drivers from which sound can be passed. The consolidated zone player can further be paired with a single zone player or yet another consolidated zone player. Each playback device of a consolidated playback device can be set in a consolidated mode, for example.

In certain embodiments, paired or consolidated zone players (also referred to as "bonded zone players") can play audio in synchrony with other zone players in the same or different zones.

According to some embodiments, one can continue to do any of: group, consolidate, and pair zone players, for example, until a desired configuration is complete. The actions of grouping, consolidation, and pairing are preferably performed through a control interface, such as using controller 130, and not by physically connecting and re-connecting speaker wire, for example, to individual, discrete speakers to create different configurations. As such, certain embodiments described herein provide a more flexible and dynamic platform through which sound reproduction can be offered to the end-user.

e. Example Audio Sources

In some embodiments, each zone can play from the same audio source as another zone or each zone can play from a different audio source. For example, someone can be grilling on the patio and listening to jazz music via zone player 124, while someone is preparing food in the kitchen and listening to classical music via zone player 102. Further, someone can be in the office listening to the same jazz music via zone player 110 that is playing on the patio via zone player 124. In some embodiments, the jazz music played via zone players 110 and 124 is played in synchrony. Synchronizing playback amongst zones allows for someone to pass through zones while seamlessly (or substantially seamlessly) listening to the audio. Further, zones can be put into a "party mode" such that all associated zones will play audio in synchrony. Sources of audio content to be played by zone players 102-124 are numerous. In some embodiments, audio on a zone player itself may be accessed and played. In some embodiments, audio on a controller may be accessed via the data network 128 and played. In some embodiments, music from a personal library stored on a computer or networked-attached storage (NAS) may be accessed via the data network 128 and played. In some embodiments, Internet radio stations, shows, and podcasts may be accessed via the data network 128 and played. Music or cloud services that let a user stream and/or download music and audio content may be accessed via the data network 128 and played. Further, music may be obtained from traditional sources, such as a turntable or CD player, via a line-in connection to a zone player, for example. Audio content may also be accessed using a different protocol, such as AIRPLAY™, which is a wireless technology by Apple, Inc., for example. Audio content received from one or more sources can be shared amongst the zone players 102 to 124 via data network 128 and/or controller 130. The above-disclosed sources of audio content are referred to herein as network-based audio information sources. However, network-based audio information sources are not limited thereto.

In some embodiments, the example home theater zone players 116, 118, 120 are coupled to an audio information source such as a television 132. In some examples, the television 132 is used as a source of audio for the home theater zone players 116, 118, 120, while in other examples audio information from the television 132 may be shared with any of the zone players 102-124 in the audio system 100.

III. Example Zone Players

Figure 4:
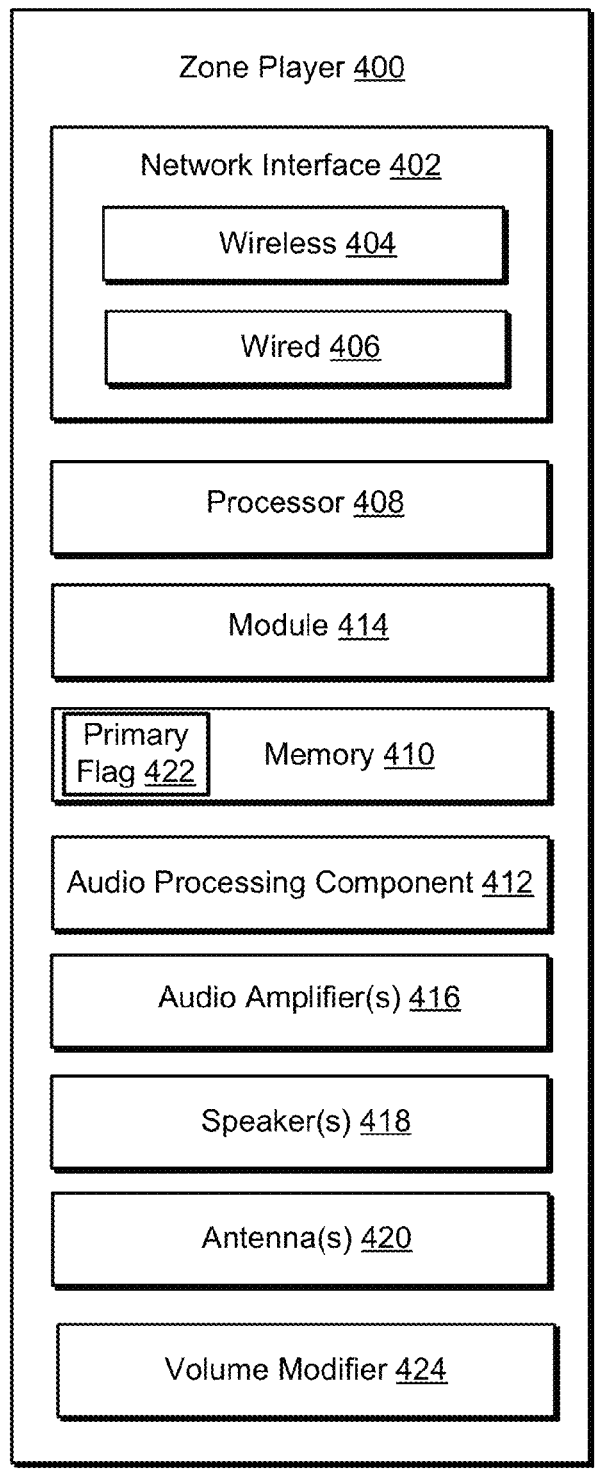
FIG. 4 shows an internal functional block diagram of an example zone player.

Referring now to FIG. 4, there is shown an example block diagram of a zone player 400 in accordance with an embodiment. Zone player 400 includes a network interface 402, a processor 408, a memory 410, an audio processing component 412, one or more modules 414, an audio amplifier 416, and a speaker unit 418 coupled to the audio amplifier 416. FIG. 2A shows an example illustration of such a zone player. Other types of zone players may not include the speaker unit 418 (e.g., such as shown in FIG. 2B) or the audio amplifier 416 (e.g., such as shown in FIG. 2C). Further, it is contemplated that the zone player 400 can be integrated into another component. For example, the zone player 400 could be constructed as part of a television, lighting, or some other device for indoor or outdoor use.

In some embodiments, network interface 402 facilitates a data flow between zone player 400 and other devices on a data network 128. In some embodiments, in addition to getting audio from another zone player or device on data network 128, zone player 400 may access audio directly from the audio source, such as over a wide area network or on the local network. In some embodiments, the network interface 402 can further handle the address part of each packet so that it gets to the right destination or intercepts packets destined for the zone player 400. Accordingly, in certain embodiments, each of the packets includes an Internet Protocol (IP)-based source address as well as an IP-based destination address. In some embodiments, network interface 402 can include one or both of a wireless interface 404 and a wired interface 406. The wireless interface 404, also referred to as a radio frequency (RF) interface, provides network interface functions for the zone player 400 to wirelessly communicate with other devices (e.g., other zone player(s), speaker(s), receiver(s), component(s) associated with the data network 128, and so on) in accordance with a communication protocol (e.g., any wireless standard including IEEE 802.11a, 802.11b, 802.11g, 802.11n, 802.15, 4G mobile communication standard, and so on). Wireless interface 404 may include one or more radios. To receive wireless signals and to provide the wireless signals to the wireless interface 404 and to transmit wireless signals, the zone player 400 includes one or more antennas 420. The wired interface 406 provides network interface functions for the zone player 400 to communicate over a wire with other devices in accordance with a communication protocol (e.g., IEEE 802.3). In some embodiments, a zone player includes multiple wireless 404 interfaces. In some embodiments, a zone player includes multiple wired 406 interfaces. In some embodiments, a zone player includes both of the interfaces 404 and 406. In some embodiments, a zone player 400 includes only the wireless interface 404 or the wired interface 406.

In some embodiments, the processor 408 is a clock-driven electronic device that is configured to process input data according to instructions stored in memory 410. The memory 410 is data storage that can be loaded with one or more software module(s) 414, which can be executed by the processor 408 to achieve certain tasks. In the illustrated embodiment, the memory 410 is a tangible machine-readable medium storing instructions that can be executed by the processor 408. In some embodiments, a task might be for the zone player 400 to retrieve audio data from another zone player or a device on a network (e.g., using a uniform resource locator (URL) or some other identifier). In some embodiments, a task may be for the zone player 400 to send audio data to another zone player or device on a network. In some embodiments, a task may be for the zone player 400 to synchronize playback of audio with one or more additional zone players. In some embodiments, a task may be to pair the zone player 400 with one or more zone players to create a multi-channel audio environment. Additional or alternative tasks can be achieved via the one or more software module(s) 414 and the processor 408.

In some embodiments, the memory 410 can include a primary flag 422. The primary flag 422 indicates whether a zone player (e.g., the zone player 400) is a primary playback device or a secondary playback device. For example, a first primary flag 422 value (e.g., the primary flag 422 is set, a positive value, a yes, a "1," etc.) may indicate the zone player 400 is a primary playback device while a secondary primary flag 422 value (e.g., the primary flag 422 is cleared, a negative value, a no, a "0," etc.) may indicate the zone player 400 is a secondary playback device. In some embodiments, a primary playback device is elected (e.g., selected, designated, etc.) from a group of playback devices (e.g., a bonded zone, a zone group), while other playback devices in the bonded zone act in the role of secondary devices. In some such embodiment, the primary playback device can have unidirectional control over the secondary playback devices. Thus, in some embodiments, the memory 410 may include a primary flag. The primary flag can indicate whether a zone player acts as a primary playback device or as a secondary playback device.

The audio processing component 412 can include one or more digital-to-analog converters (DAC), an audio preprocessing component, an audio enhancement component or a digital signal processor, and so on. In some embodiments, the audio processing component 412 may be part of processor 408. In some embodiments, the audio that is retrieved via the network interface 402 is processed and/or intentionally altered by the audio processing component 412. Further, the audio processing component 412 can produce analog audio signals. The processed analog audio signals are then provided to the audio amplifier 416 for playback through speakers 418. In addition, the audio processing component 412 can include circuitry to process analog or digital signals as inputs to play from zone player 400, send to another zone player on a network, or both play and send to another zone player on the network. An example input includes a line-in connection (e.g., an auto-detecting 3.5 mm audio line-in connection).

In some embodiments, the zone player 400 can include a volume modifier 424. In some embodiments, the volume modifier 424 may be included in the processor 408 and/or the audio processing component 412. In some embodiments, the volume modifier 424 receives an information packet including user input. For example, a user may select to adjust (e.g., increase or decrease) the volume of a zone player. In some such embodiments, the change in volume can be included in an information packet. In some embodiments, a user may select to adjust the gain of a playback device. The gain of a playback is a multiplier that determines how much audio output can be expected from the playback device for a given input signal amplifier. In some embodiments, this gain (or level) can be determined as a ratio of the output voltage between speaker terminals of the playback device to the input voltage to the amplifier of the playback device. In some embodiments, the information packet is obtained via a user interface associated with (e.g., included in, coupled with, etc.) the playback device. In some embodiments, the information packet is obtained via the network interface 402. For example, a user can adjust the volume for a first playback device by selecting a desired volume change via a controller (e.g., the example controller 300 of FIG. 3) and/or a user interface included with a second playback device. In some embodiments, the volume modifier 424 processes and/or intentionally alters the audio that is retrieved via the network interface 402 based on the obtained information packet (e.g., a volume change). The volume modifier 424 can then provide the volume adjusted audio signal to the audio processing component 412 for further processing and/or the audio amplifier 416 for playback through a speaker(s) 418.

In some embodiments, the volume may be adjusted directly by the amplifier. For example, the audio amplifier 416 may adjust the audio volume directly by changing the audio gain based on volume information (e.g., a gain value) included in the information packet.

In some examples, the volume modifier 424 may determine how to adjust audio for playback in a bonded zone. For example, the primary playback device may store what playback devices are included in the bonded zone and the playback characteristics of the playback devices. Thus, in some examples, the primary playback device is able to "personalize" audio for playback for each playback device. That is, each playback device in the bonded zone may receive audio adjusted for playback that is optimized for the respective playback device. In some examples, the primary playback device may receive an indication to increase the volume. However, the audio volume may be set for the entire bonded zone. Thus, when adjusting the audio for each playback device, the audio adjustments for each playback may be different to enable the group increase in volume. That is, even though a volume up was input at a secondary playback device, to effectuate the volume up request for the bonded zone audio, the secondary playback device may not increase in volume. Rather, other playback devices in the bonded zone may playback adjusted audio accordingly.

The audio amplifier 416 is a device(s) that amplifies audio signals to a level for driving one or more speakers 418. The one or more speakers 418 can include an individual transducer (e.g., a "driver") or a complete speaker system that includes an enclosure including one or more drivers. A particular driver can be a subwoofer (e.g., for low frequencies), a mid-range driver (e.g., for middle frequencies), and a tweeter (e.g., for high frequencies), for example. An enclosure can be sealed or ported, for example. Each transducer may be driven by its own individual amplifier.

A commercial example, presently known as the PLAY:5™, is a zone player with a built-in amplifier and speakers that is capable of retrieving audio directly from the source, such as on the Internet or on the local network, for example. In particular, the PLAY:5™ is a five-amp, five-driver speaker system that includes two tweeters, two mid-range drivers, and one woofer. When playing audio content via the PLAY:5™, the left audio data of a track is sent out of the left tweeter and left mid-range driver, the right audio data of a track is sent out of the right tweeter and the right mid-range driver, and mono bass is sent out of the subwoofer. Further, both mid-range drivers and both tweeters have the same equalization (or substantially the same equalization). That is, they are both sent the same frequencies but from different channels of audio. Audio from Internet radio stations, online music and video services, downloaded music, analog audio inputs, television, DVD, and so on, can be played from the PLAY:5™.

IV. Example Controller

Figure 5:
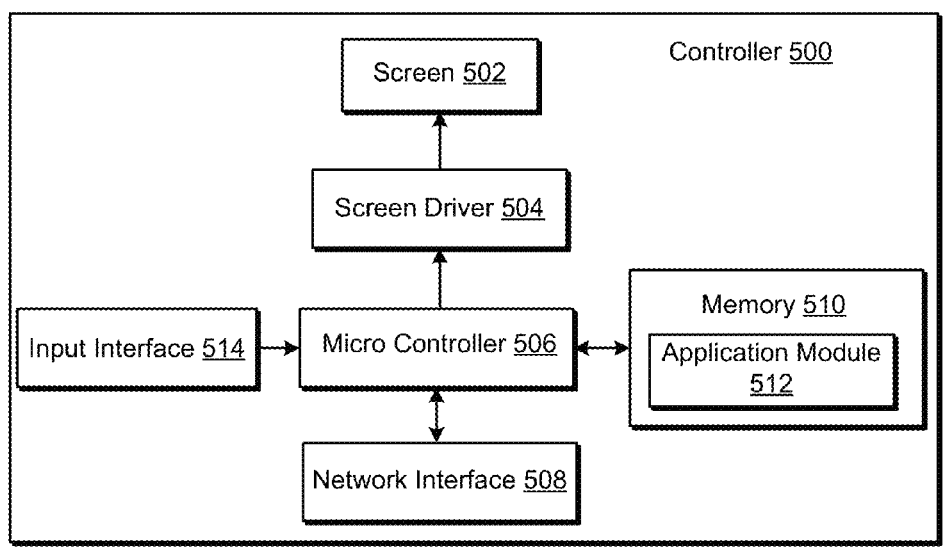
FIG. 5 shows an internal functional block diagram of an example controller.

Referring now to FIG. 5, there is shown an example block diagram for controller 500, which can correspond to the controlling device 130 in FIG. 1. Controller 500 can be used to facilitate the control of multi-media applications, automation and others in a system. In particular, the controller 500 may be configured to facilitate a selection of a plurality of audio sources available on the network and enable control of one or more zone players (e.g., the zone players 102-124 in FIG. 1) through a wireless or wired network interface 508. According to one embodiment, the wireless communications is based on an industry standard (e.g., infrared, radio, wireless standards including IEEE 802.11a, 802.11b, 802.11g, 802.11n, 802.15, 4G mobile communication standard, and so on). Further, when a particular audio is being accessed via the controller 500 or being played via a zone player, a picture (e.g., album art) or any other data, associated with the audio and/or audio source can be transmitted from a zone player or other electronic device to controller 500 for display.

Controller 500 is provided with a screen 502 and an input interface 514 that allows a user to interact with the controller 500, for example, to navigate a playlist of many multimedia items and to control operations of one or more zone players. The screen 502 on the controller 500 can be an LCD screen, for example. The screen 500 communicates with and is commanded by a screen driver 504 that is controlled by a microcontroller (e.g., a processor) 506. The memory 510 can be loaded with one or more application modules 512 that can be executed by the microcontroller 506 with or without a user input via the user interface 514 to achieve certain tasks. In some embodiments, an application module 512 is configured to facilitate grouping a number of selected zone players into a zone group and synchronizing the zone players for audio playback. In some embodiments, an application module 512 is configured to control the audio sounds (e.g., volume) of the zone players in a zone group. In operation, when the microcontroller 506 executes one or more of the application modules 512, the screen driver 504 generates control signals to drive the screen 502 to display an application specific user interface accordingly.

The controller 500 includes a network interface 508 that facilitates wired or wireless communication with a zone player. In some embodiments, the commands such as volume control and audio playback synchronization are sent via the network interface 508. In some embodiments, a saved zone group configuration is transmitted between a zone player and a controller via the network interface 508. The controller 500 can control one or more zone players, such as 102-124 of FIG. 1. There can be more than one controller for a particular system, and each controller may share common information with another controller, or retrieve the common information from a zone player, if such a zone player stores configuration data (e.g., such as a state variable). Further, a controller can be integrated into a zone player.

It should be noted that other network-enabled devices such as an IPHONE™, IPAD™ or any other smart phone or network-enabled device (e.g., a networked computer such as a PC or MAC™) can also be used as a controller to interact or control zone players in a particular environment. In some embodiments, a software application or upgrade can be downloaded onto a network-enabled device to perform the functions described herein.

In certain embodiments, a user can create a zone group (also referred to as a bonded zone) including at least two zone players from the controller 500. The zone players in the zone group can play audio in a synchronized fashion, such that all of the zone players in the zone group playback an identical audio source or a list of identical audio sources in a synchronized manner such that no (or substantially no) audible delays or hiccups are to be heard. Similarly, in some embodiments, when a user increases the audio volume of the group from the controller 500, the signals or data of increasing the audio volume for the group are sent to one of the zone players and causes other zone players in the group to be increased together in volume.

In some embodiments including a bonded zone (e.g., one or more grouped, consolidated and/or paired zone players), one of the zone players may be designated as a primary playback device, while the remaining zone player(s) may be designated as a secondary (or satellite) playback device(s). In addition, any playback device may be designated a primary playback device for the bonded zone. A primary playback device performs signal processing on multimedia content (e.g., an audio stream, etc.) and sends processed (e.g., filtered) content to each secondary playback device of the zone configuration. For example, a primary playback device in a stereo pair may receive an audio stream and separate (e.g., process) the left channel and the right channel of the audio stream for playback. In some such embodiments, if the primary playback device is tasked with playback of the left channel audio, then the primary playback device of the bonded zone sends (e.g., transmits, communicates, etc.) the right channel audio to the secondary playback device for playback. In some such embodiments, the primary playback device adjusts the sound (e.g., balance, volume levels and/or timing delays) of the audio signal and sends the adjusted audio signal(s) to the secondary playback device(s).

A user via the controller 500 can group zone players into a zone group by activating a "Link Zones" or "Add Zone" soft button, or de-grouping a zone group by activating an "Unlink Zones" or "Drop Zone" button. For example, one mechanism for 'joining' zone players together for audio playback is to link a number of zone players together to form a group. To link a number of zone players together, a user can manually link each zone player or room one after the other. For example, assume that there is a multi-zone system that includes the following zones: Bathroom, Bedroom, Den, Dining Room, Family Room, and Foyer.

In certain embodiments, a user can link any number of the six zone players, for example, by starting with a single zone and then manually linking each zone to that zone.

In certain embodiments, a set of zones can be dynamically linked together using a command to create a zone scene or theme (subsequent to first creating the zone scene). For instance, a "Morning" zone scene command can link the Bedroom, Office, and Kitchen zones together in one action. Without this single command, the user would manually and individually link each zone. The single command may include a mouse click, a double mouse click, a button press, a gesture, or some other programmed or learned action. Other kinds of zone scenes can be programmed or learned by the system over time.

In certain embodiments, a zone scene can be triggered based on time (e.g., an alarm clock function). For instance, a zone scene can be set to apply at 8:00 am. The system can link appropriate zones automatically, set specific music to play, and then stop the music after a defined duration. Although any particular zone can be triggered to an "On" or "Off" state based on time, for example, a zone scene enables any zone(s) linked to the scene to play a predefined audio (e.g., a favorable song, a predefined playlist) at a specific time and/or for a specific duration. If, for any reason, the scheduled music failed to be played (e.g., an empty playlist, no connection to a share, failed Universal Plug and Play (UPnP), no Internet connection for an Internet Radio station, and so on), a backup buzzer can be programmed to sound. The buzzer can include a sound file that is stored in a zone player, for example.

V. Playback Queue

As discussed above, in some embodiments, a zone player may be assigned to a playback queue identifying zero or more media items for playback by the zone player. The media items identified in a playback queue may be represented to the user via an interface on a controller. For instance, the representation may show the user (or users if more than one controller is connected to the system) how the zone player is traversing the playback queue, such as by highlighting the "now playing" item, graying out the previously played item(s), highlighting the to-be-played item(s), and so on.

In some embodiments, a single zone player is assigned to or otherwise associated with a playback queue. For example, zone player 114 in the bathroom of FIG. 1 may be linked or assigned to a "Bathroom" playback queue. In an embodiment, the "Bathroom" playback queue might have been established by the system as a result of the user naming the zone player 114 to the bathroom. As such, contents populated and identified in the "Bathroom" playback queue can be played via the zone player 114 (the bathroom zone).

In some embodiments, a zone or zone group is assigned to a playback queue. For example, zone players 106 and 108 in the family room of FIG. 1 may be linked or assigned to a "Family room" playback queue. In another example, if family room and dining room zones were grouped, then the new group would be linked or assigned to a "family room+dining room" playback queue. In some embodiments, the family room+dining room playback queue would be established based upon the creation of the group. In some embodiments, upon establishment of the new group, the family room+dining room playback queue can automatically include the contents of one (or both) of the playback queues associated with either the family room or dining room or both. In one instance, if the user started with the family room and added the dining room, then the contents of the family room playback queue would become the contents of the family room+dining room playback queue. In another instance, if the user started with the family room and added the dining room, then the family room playback queue would be renamed to the family room+dining room playback queue. If the new group was "ungrouped," then the family room+dining room playback queue may be removed from the system and/or renamed to one of the zones (e.g., renamed to "family room" or "dining room"). After ungrouping, each of the family room and the dining room will be assigned to a separate playback queue. One or more of the zone players in the zone or zone group may store in memory the associated playback queue.

As such, when zones or zone groups are "grouped" or "ungrouped" dynamically by the user via a controller, the system will, in some embodiments, establish or remove/rename playback queues respectively, as each zone or zone group is to be assigned to a playback queue. In other words, the playback queue operates as a container that can be populated with media items for playback by the assigned zone. In some embodiments, the media items identified in a playback queue can be manipulated (e.g., re-arranged, added to, deleted from, and so on).

Figure 6:
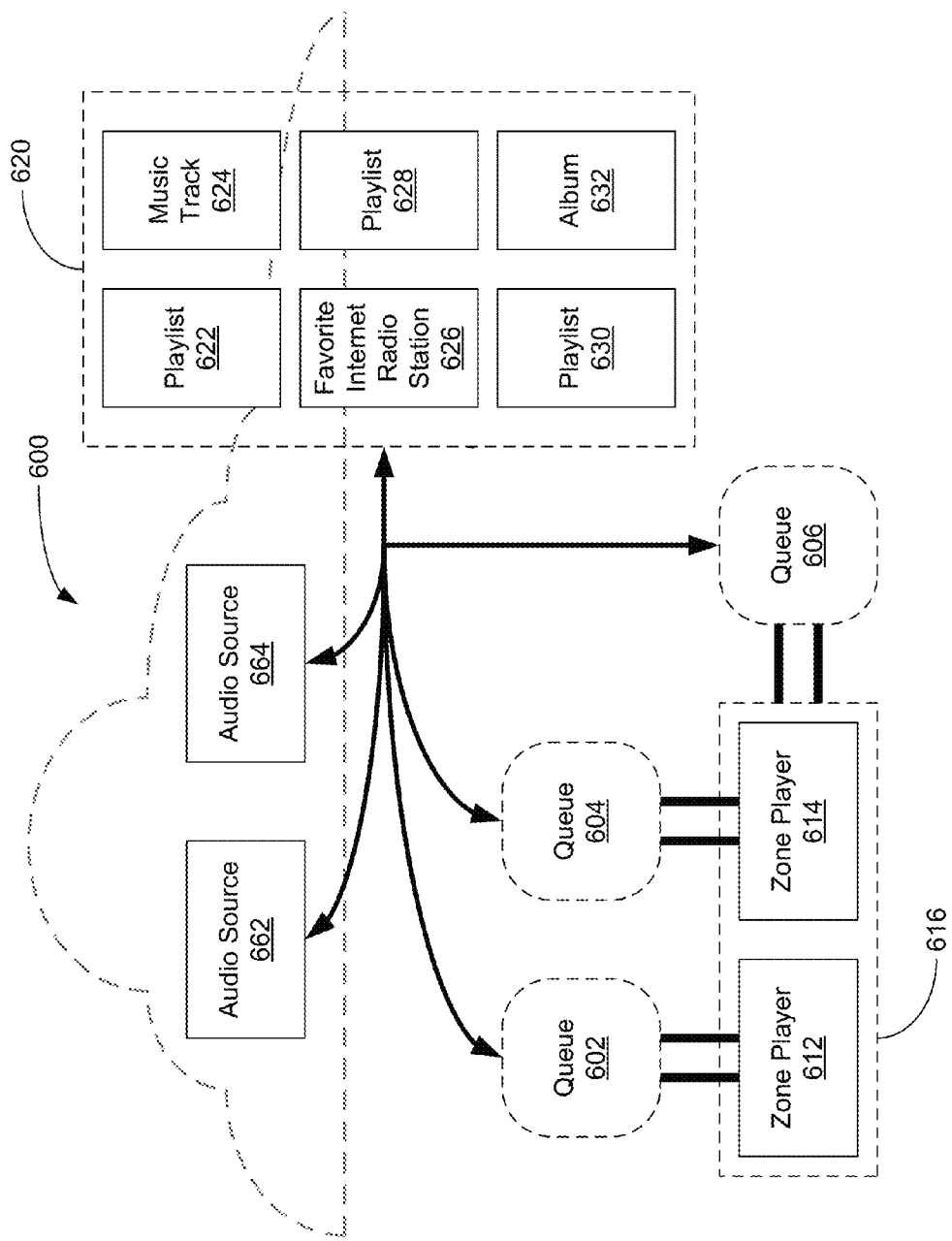
FIG. 6 shows an example network for media content playback.

By way of illustration, FIG. 6 shows an example network 600 for media content playback. As shown, the example network 600 includes example zone players 612 and 614, example audio sources 662 and 664, and example media items 620. The example media items 620 may include playlist 622, music track 624, favorite Internet radio station 626, playlists 628 and 630, and album 632. In one embodiment, the zone players 612 and 614 may be any of the zone players shown in FIGS. 1, 2, and 4. For instance, zone players 612 and 614 may be the zone players 106 and 108 in the Family Room.

In one example, the example audio sources 662 and 664, and example media items 620 may be partially stored on a cloud network, discussed more below in connection to FIG. 8. In some cases, the portions of the audio sources 662, 664, and example media items 620 may be stored locally on one or both of the zone players 612 and 614. In one embodiment, playlist 622, favorite Internet radio station 626, and playlist 630 may be stored locally, and music track 624, playlist 628, and album 632 may be stored on the cloud network.

Each of the example media items 620 may be a list of media items playable by a zone player(s). In one embodiment, the example media items may be a collection of links or pointers (e.g., URI) to the underlying data for media items that are stored elsewhere, such as the audio sources 662 and 664. In another embodiment, the media items may include pointers to media content stored on the local zone player, another zone player over a local network, or a controller device connected to the local network.

As shown, the example network 600 may also include an example queue 602 associated with the zone player 612, and an example queue 604 associated with the zone player 614. Queue 606 may be associated with a group, when in existence, comprising zone players 612 and 614. Queue 606 might comprise a new queue or exist as a renamed version of queue 602 or 604. In some embodiments, in a group (e.g., a bonded zone or a zone group), the zone players 612 and 614 would be assigned to queue 606 and queue 602 and 604 would not be available at that time. In some embodiments, when the group is no longer in existence, queue 606 is no longer available. Each zone player and each combination of zone players in a network of zone players, such as those shown in FIG. 1 or that of example zone players 612, 614, and example combination 616, may be uniquely assigned to a corresponding playback queue.

A playback queue, such as playback queues 602, 604, 606, may include identification of media content to be played by the corresponding zone player or combination of zone players. As such, media items added to the playback queue are to be played by the corresponding zone player or combination of zone players. The zone player may be configured to play items in the queue according to a specific order (such as an order in which the items were added), in a random order, or in some other order.

The playback queue may include a combination of playlists and other media items added to the queue. In one embodiment, the items in playback queue 602 to be played by the zone player 612 may include items from the audio sources 662, 664, or any of the media items 622, 624, 626, 628, 630, 632. The playback queue 602 may also include items stored locally on the zone player 612, or items accessible from the zone player 614. For instance, the playback queue 602 may include Internet radio 626 and album 632 items from audio source 662, and items stored on the zone player 612.

When a media item is added to the queue via an interface of a controller, a link to the item may be added to the queue. In a case of adding a playlist to the queue, links to the media items in the playlist may be provided to the queue. For example, the playback queue 602 may include pointers from the Internet radio 626 and album 632, pointers to items on the audio source 662, and pointers to items on the zone player 612. In another case, a link to the playlist, for example, rather than a link to the media items in the playlist may be provided to the queue, and the zone player or combination of zone players may play the media items in the playlist by accessing the media items via the playlist. For example, the album 632 may include pointers to items stored on audio source 662. Rather than adding links to the items on audio source 662, a link to the album 632 may be added to the playback queue 602, such that the zone player 612 may play the items on the audio source 662 by accessing the items via pointers in the playlist 632.

In some cases, contents as they exist at a point in time within a playback queue may be stored as a playlist, and subsequently added to the same queue later or added to another queue. For example, contents of the playback queue 602, at a particular point in time, may be saved as a playlist, stored locally on the zone player 612 and/or on the cloud network. The saved playlist may then be added to playback queue 604 to be played by zone player 614.

VI. Example Ad-Hoc Network

Figure 7:
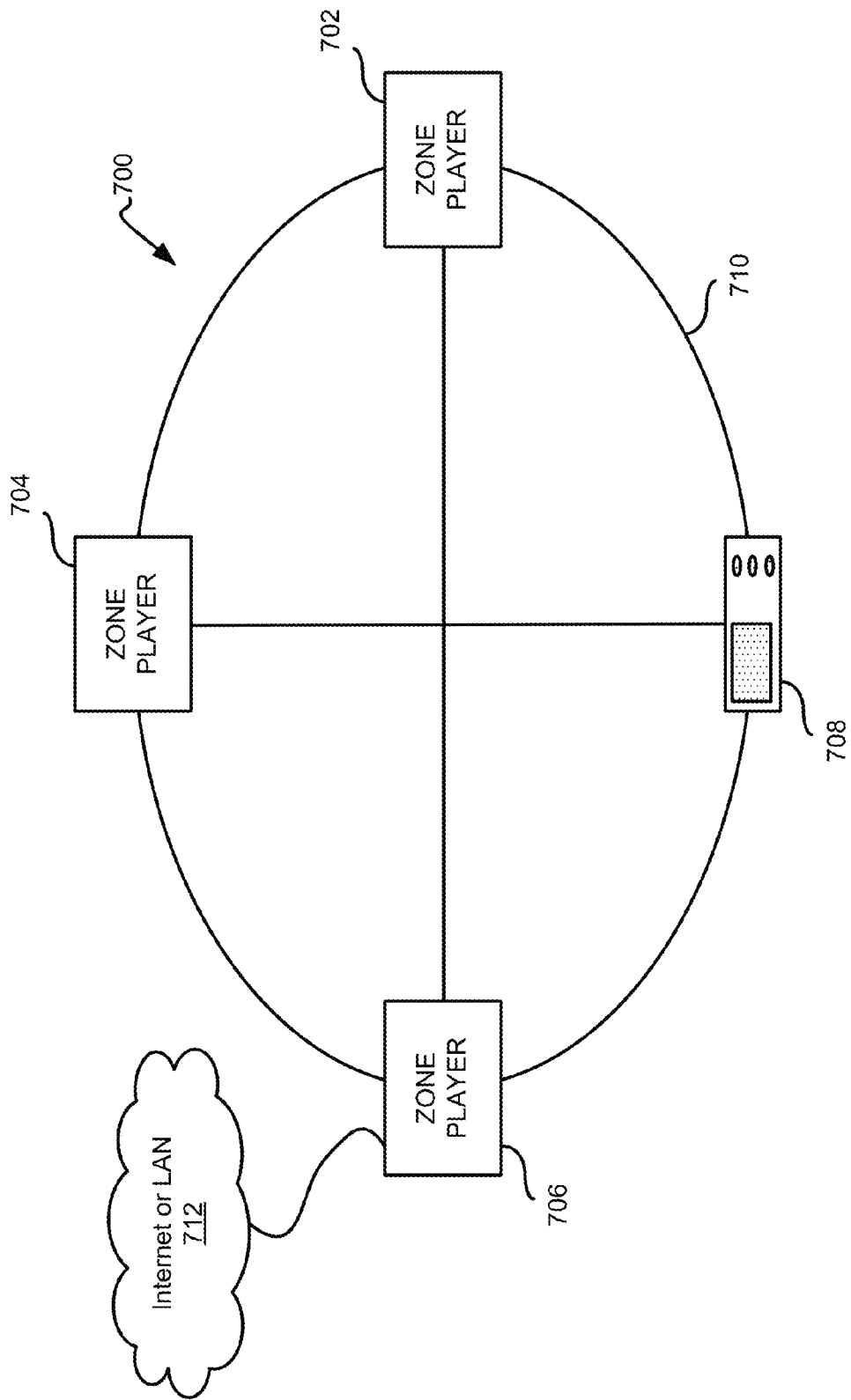
FIG. 7 shows an example ad-hoc playback network.

Particular examples are now provided in connection with FIG. 7 to describe, for purposes of illustration, certain embodiments to provide and facilitate connection to a playback network. FIG. 7 shows that there are three zone players 702, 704 and 706 and a controller 708 that form a network branch that is also referred to as an Ad-Hoc network 710. The network 710 may be wireless, wired, or a combination of wired and wireless technologies. In general, an Ad-Hoc (or "spontaneous") network is a local area network or other small network in which there is generally no one access point for all traffic. With an established Ad-Hoc network 710, the devices 702, 704, 706 and 708 can all communicate with each other in a "peer-to-peer" style of communication, for example. Furthermore, devices may join and/or leave from the network 710, and the network 710 will automatically reconfigure itself without needing the user to reconfigure the network 710. While an Ad-Hoc network is referenced in FIG. 7, it is understood that a playback network may be based on a type of network that is completely or partially different from an Ad-Hoc network.

Using the Ad-Hoc network 710, the devices 702, 704, 706, and 708 can share or exchange one or more audio sources and be dynamically grouped (or ungrouped) to play the same or different audio sources. For example, the devices 702 and 704 are grouped to playback one piece of music, and at the same time, the device 706 plays back another piece of music. In other words, the devices 702, 704, 706 and 708, as shown in FIG. 7, form a HOUSEHOLD that distributes audio and/or reproduces sound. As used herein, the term HOUSEHOLD (provided in uppercase letters to disambiguate from the user's domicile) is used to represent a collection of networked devices that are cooperating to provide an application or service. An instance of a HOUSEHOLD is identified with a household 710 (or household identifier), though a HOUSEHOLD may be identified with a different area or place.

In certain embodiments, a household identifier (HHID) is a short string or an identifier that is computer-generated to help ensure that it is unique. Accordingly, the network 710 can be characterized by a unique HHID and a unique set of configuration variables or parameters, such as channels (e.g., respective frequency bands), service set identifier (SSID) (a sequence of alphanumeric characters as a name of a wireless network), and WEP keys (wired equivalent privacy) or other security keys. In certain embodiments, SSID is set to be the same as HHID.

In certain embodiments, each HOUSEHOLD includes two types of network nodes: a control point (CP) and a zone player (ZP). The control point controls an overall network setup process and sequencing, including an automatic generation of required network parameters (e.g., security keys). In an embodiment, the CP also provides the user with a HOUSEHOLD configuration user interface. The CP function can be provided by a computer running a CP application module, or by a handheld controller (e.g., the controller 708) also running a CP application module, for example. The zone player is any other device on the network that is placed to participate in the automatic configuration process. The ZP, as a notation used herein, includes the controller 708 or a computing device, for example. In some embodiments, the functionality, or certain parts of the functionality, in both the CP and the ZP are combined at a single node (e.g., a ZP contains a CP or vice-versa).

In certain embodiments, configuration of a HOUSEHOLD involves multiple CPs and ZPs that rendezvous and establish a known configuration such that they can use a standard networking protocol (e.g., IP over Wired or Wireless Ethernet) for communication. In an embodiment, two types of networks/protocols are employed: Ethernet 802.3 and Wireless 802.11g. Interconnections between a CP and a ZP can use either of the networks/protocols. A device in the system as a member of a HOUSEHOLD can connect to both networks simultaneously.

In an environment that has both networks in use, it is assumed that at least one device in a system is connected to both as a bridging device, thus providing bridging services between wired/wireless networks for others. The zone player 706 in FIG. 7 is shown to be connected to both networks, for example. The connectivity to the network 712 is based on Ethernet and/or Wireless, while the connectivity to other devices 702, 704 and 708 is based on Wireless and Ethernet if so desired.

It is understood, however, that in some embodiments each zone player 706, 704, 702 may access the Internet when retrieving media from the cloud (e.g., the Internet) via the bridging device. For example, zone player 702 may contain a uniform resource locator (URL) that specifies an address to a particular audio track in the cloud. Using the URL, the zone player 702 may retrieve the audio track from the cloud, and ultimately play the audio out of one or more zone players.

VII. Another Example System Configuration

Figure 8:
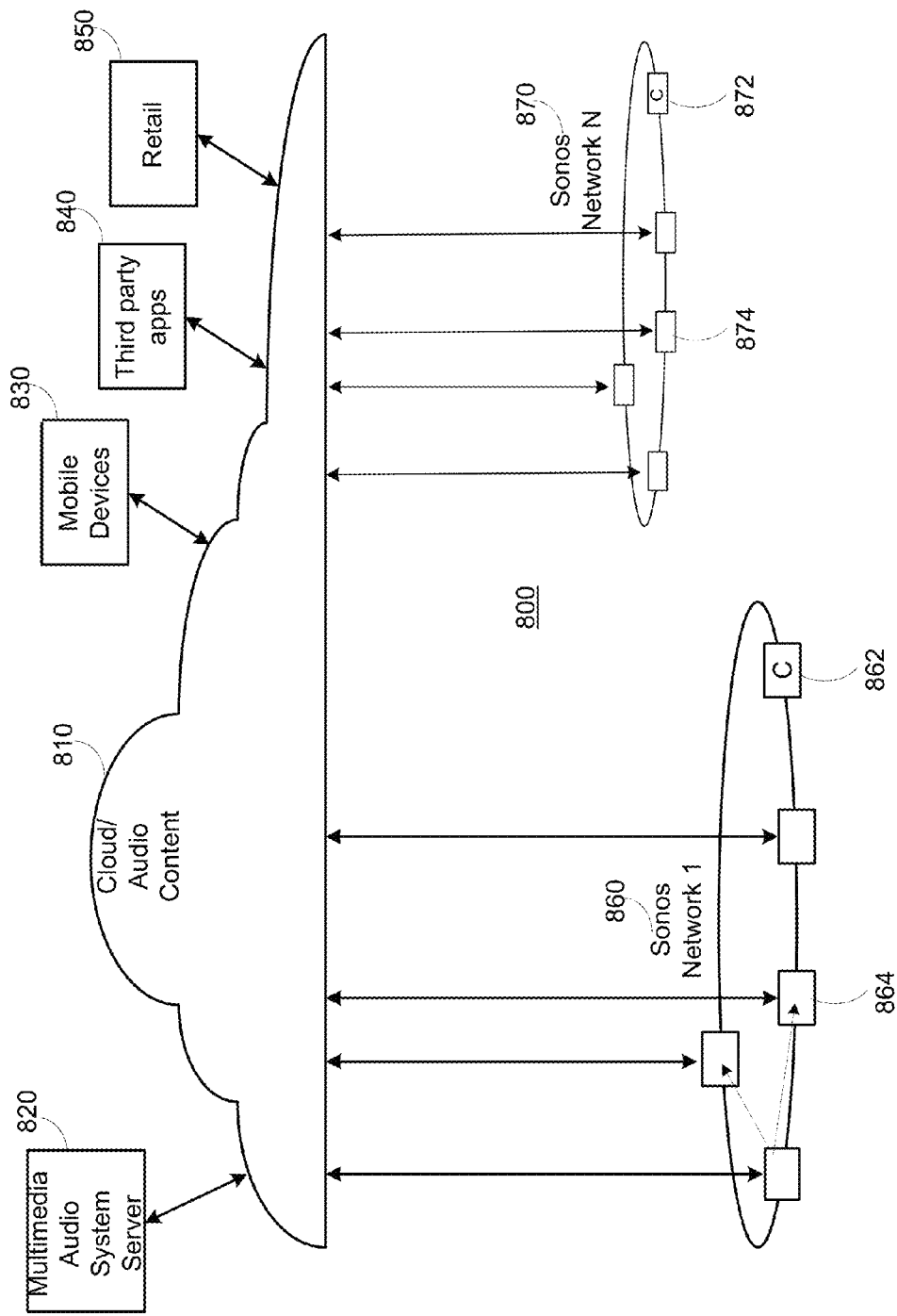
FIG. 8 shows a system including a plurality of networks including a cloud-based network and at least one local playback network.

FIG. 8 shows a system 800 including a plurality of interconnected networks including a cloud-based network and at least one local playback network. A local playback network includes a plurality of playback devices or players, though it is understood that the playback network may contain only one playback device. In certain embodiments, each player has an ability to retrieve its content for playback. Control and content retrieval can be distributed or centralized, for example. Input can include streaming content provider input, third party application input, mobile device input, user input, and/or other playback network input into the cloud for local distribution and playback.

As illustrated by the example system 800 of FIG. 8, a plurality of content providers 820-850 can be connected to one or more local playback networks 860-870 via a cloud and/or other network 810. Using the cloud 810, a multimedia audio system server 820 (e.g., Sonos™), a mobile device 830, a third party application 840, a content provider 850 and so on can provide multimedia content (requested or otherwise) to local playback networks 860, 870. Within each local playback network 860, 870, a controller 862, 872 and a playback device 864, 874 can be used to playback audio content.

VIII. Example Methods of Satellite Volume Control

Figure 9:
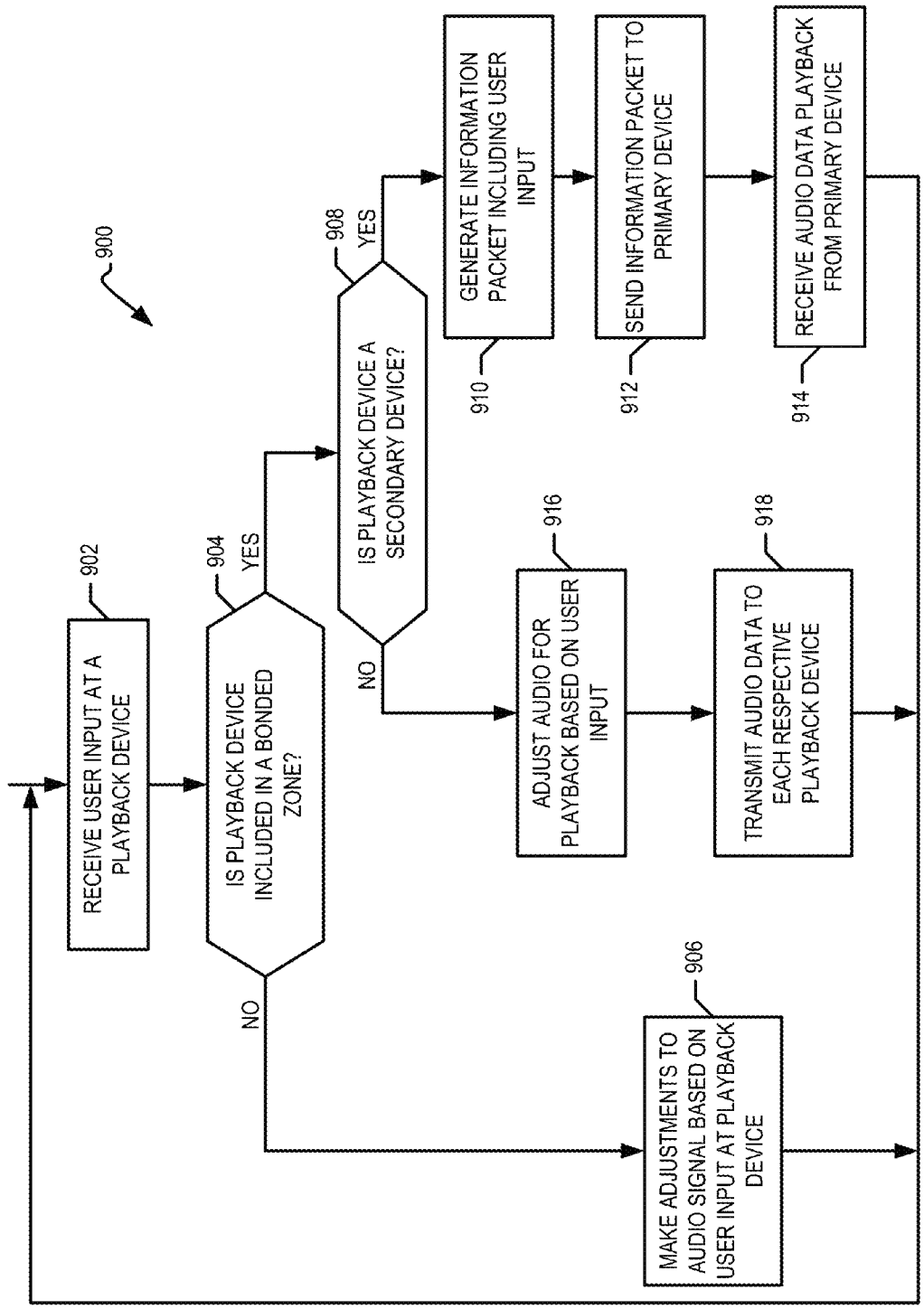
FIG. 9 shows an illustrative flowchart for an example method for satellite volume control.

FIG. 9 shows an illustrative flowchart for an example method 900 for satellite volume control, in accordance with at least some embodiments described herein. The example method 900 of FIG. 9 begins at block 902 when user input is received at a playback device. For example, the playback device (e.g., playback device 400 of FIG. 4) may include a user interface such as a touch screen, a button(s), a control(s), a microphone, etc. to receive user input. At block 904, a determination is made whether the playback device is included in a bonded zone. If, at block 904, the playback device is not included in a bonded zone, then, at block 906, the received user input is applied to the playback device. For example, the playback device makes adjustments to (e.g., processes) an audio signal for playback based on the user input. Control then returns to block 902 to receive another user input.

If, at block 904, the playback device is included in a bonded zone, then, at block 908, a determination is made as to whether the playback device is a secondary playback device. For example, a processor (e.g., the processor 408 of FIG. 4) checks the status of a primary flag (e.g., the primary flag 422) included in a memory (e.g., the memory 410 of FIG. 4). If, at block 908, the primary flag is cleared (e.g., a negative value, a "0," a "no," etc.), then the playback device is a secondary playback device. In contrast, if the primary flag is set (e.g., a positive value, a "1," a "yes," etc.), the playback device is a primary playback device.

If, at block 908, the playback device is determined to be a secondary playback device, then, at block 910, the secondary playback device generates an information packet based on the user input. In some examples, the secondary playback device may generate an information packet for each user input. For example, each volume up tap, gesture, voice command or other indication may generate an information packet. In some examples, the secondary playback device may collect information over a collection period and generate an information packet when the collection period expires. For example, a timer (e.g., implemented using a software module 414 stored in the memory 410 of FIG. 4 and executed by the processor 408) corresponding to the collection period may initiate when user input is received (e.g., at block 902). The collection period may expire after half a second, one second, two seconds, etc. The user input(s) received during the collection period are aggregated and included in an information packet.

At block 912, the secondary playback device sends the information packet to a primary playback device included in the bonded zone. For example, the secondary playback device may transmit (or communicate) the information packet to a primary playback device via a network (e.g., the data network 128 of FIG. 1). In some examples, the secondary playback device may transmit the information packet to an intermediary (or proxy) device (e.g., a second secondary playback device, a controller, a server, a repeater, etc.) that forwards the information packet to the primary playback device or a second intermediary device.

At block 914, the secondary playback device receives audio data from the primary playback device, the audio data based on the user input included in the information packet. In some examples, the audio data may be a volume adjusted (e.g., processed) audio signal for playback by the secondary playback device. For example, the secondary playback device may be tasked with playback of left channel audio of an audio signal while the primary playback device may be tasked with playback of right channel audio of the audio signal. In such examples, the audio data received by the secondary playback device may include left channel audio that is volume adjusted based on the user input. In some examples, the audio data may include gain parameter(s) to have the secondary device adjust the gain of the audio. In some examples, the audio data may include a test tone(s) for the secondary playback device to playback. For example, during system configuration (e.g., a 5.1 sound system), a test tone or series of test tones may be periodically or aperiodically played by the different playback devices to enable a user to confirm the playback device(s) are correctly associated with their respective channels, are positioned properly in the listening environment, etc. For example, a left channel audio test tone played back by a secondary playback device associated with right channel audio indicates the secondary playback device is incorrectly positioned in the listening environment or configured. Control then returns to block 902 to receive another user input.

Returning to block 908, if the playback device is a primary playback device, then, at block 916, audio data is adjusted for playback based on user input. In some examples, the primary playback device adjusts an audio signal while the bonded zone of playback devices is in playback mode but not playing content. For example, the bonded zone of playback devices may be in a paused playback mode. In some other examples, the primary playback device adjusts a test tone(s) for playback by the bonded zone of playback devices. At block 918, the primary playback device transmits the adjusted audio data for playback to each playback device included in the bonded zone. Control then returns to block 902 to receive another user input.

Figure 10:
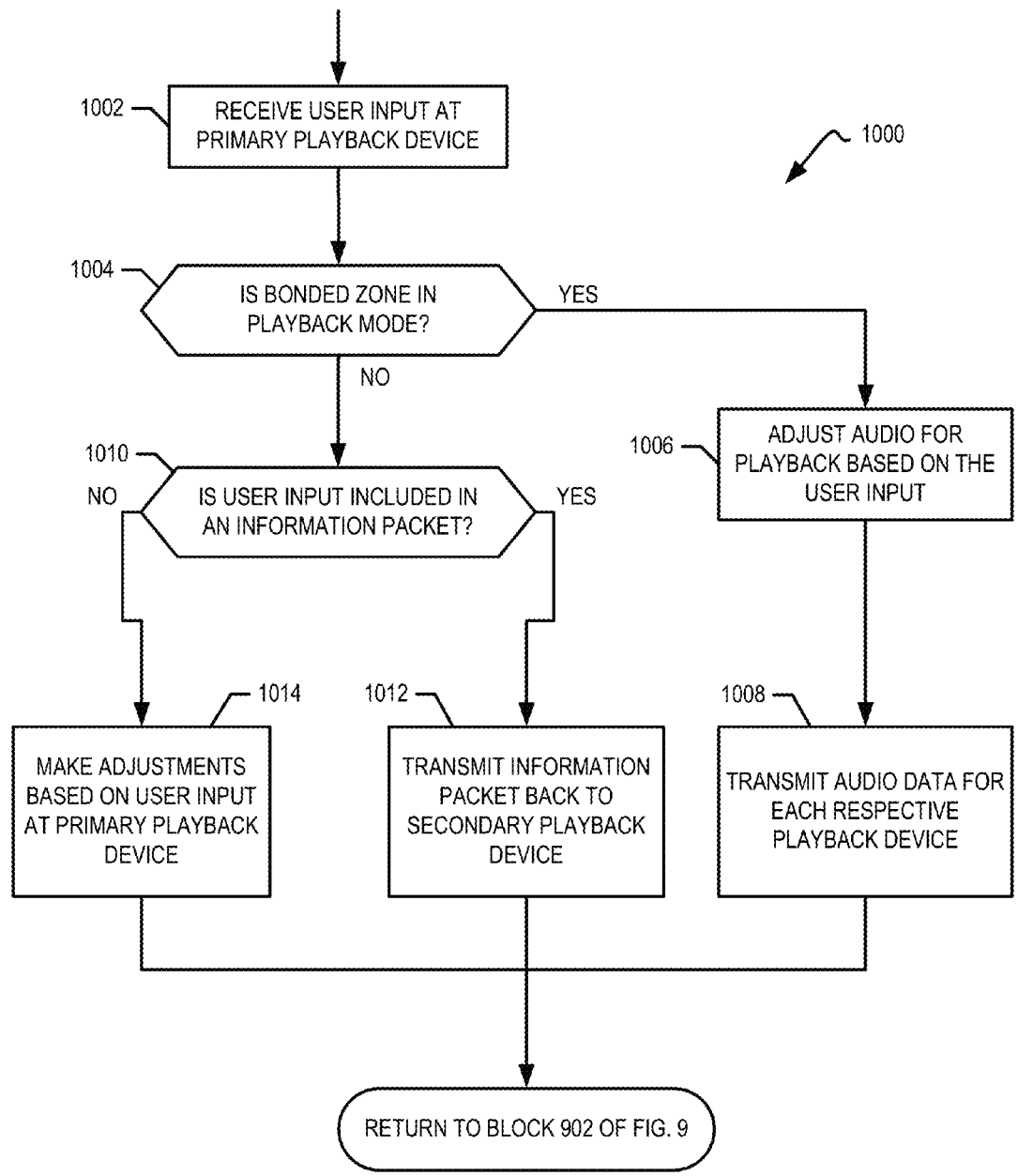
FIG. 10 shows an illustrative flowchart for an example method for volume control in a bonded zone.

FIG. 10 shows an illustrative flowchart for an example method 1000 for volume control in a bonded zone. The example method 1000 begins at block 1002 when a primary playback device receives an information packet. For example, the primary playback device may receive an information packet including user input from a secondary playback device. In some other examples, the primary playback device may receive the user input via a user interface included or associated with the primary playback device.

At block 1004, a determination is made whether the bonded zone is in playback mode. For example, a determination is made whether at least one of the playback devices included in the bonded zone is outputting an audio signal.

If, at block 1004, the bonded zone is in playback mode, then, at block 1006, the primary playback device adjusts the audio signal based on the user input. In some examples, a volume modifier (e.g., the volume modifier 424 of FIG. 4) processes and/or adjusts the audio signal for each playback device in the bonded zone. For example, a bonded zone that includes a full-frequency playback device, a subwoofer and two satellite playback devices (e.g., a left rear audio playback device and a right rear audio playback device), may designate the full-frequency playback device as the primary playback device. As a result, the full-frequency playback device receives full frequency spectrum audio and adjusts (e.g., filters) the audio frequency spectrum for the secondary playback devices. For example, the primary playback device may filter the low frequency spectrum audio to the subwoofer and the left- and right-rear audio channels of the full frequency spectrum audio to the two satellite playback devices, respectively. At block 1008, the adjusted audio is transmitted to each respective playback device in the bonded zone.

In some examples, the playback device may include a buffer to store a portion of audio temporarily. In some such examples, the primary playback device may not send processed audio to the secondary playback device. Rather, the primary playback device may send unprocessed audio to the secondary playback device and information (e.g., a packet, a message, etc.) indicating how the secondary playback device is to adjust the audio based on the user input. For example, a user may indicate to increase the audio volume in a bonded zone including a primary playback device and two secondary playback devices via one of the secondary playback devices. Accordingly, the primary playback device determines audio adjustments that the two secondary playback devices are to make to the audio during playback. The primary playback device may send the audio along with the audio adjustment for each of the two secondary playback devices to the respective secondary playback device. In some examples, the playback devices (e.g., the primary playback device and the two secondary playback devices) store the audio in the buffer while the volume modifier of each playback device processes the audio. By using the buffer, the audio at each of the playback devices can be synchronized before playback of the audio.

Control may then return to block 902 of FIG. 9 to receive user input.

Returning to block 1004, if the bonded zone is not in a playback mode (e.g., during a system configuration mode), then, at block 1010, a determination is made whether the user input received at the primary playback device was included in an information packet. For example, a secondary playback device may generate and send an information packet including user input received at the secondary playback device to the primary playback device. If, at block 1010, the received user input is included in an information packet (e.g., obtained from a secondary playback device), then, at block 1012, the primary playback device returns the information packet to the secondary playback device for processing. That is, in some examples, if a secondary playback device receives user input while the bonded zone is not in playback mode, the secondary playback device is tasked with adjusting audio settings locally. Control may then return to block 902 of FIG. 9 to receive user input.

Returning to block 1010, if the user input is not included in an information packet (e.g., the user input was received at the primary playback device via a user interface included or otherwise associated with the primary playback device), then, at block 1014, the primary playback device makes adjustments to audio settings based on the user input locally. That is, in some examples, the primary playback device may process the user input and not transmit information to the secondary playback device(s) in the bonded zone. Control may then return to block 902 of FIG. 9 to receive user input.

Figure 11:
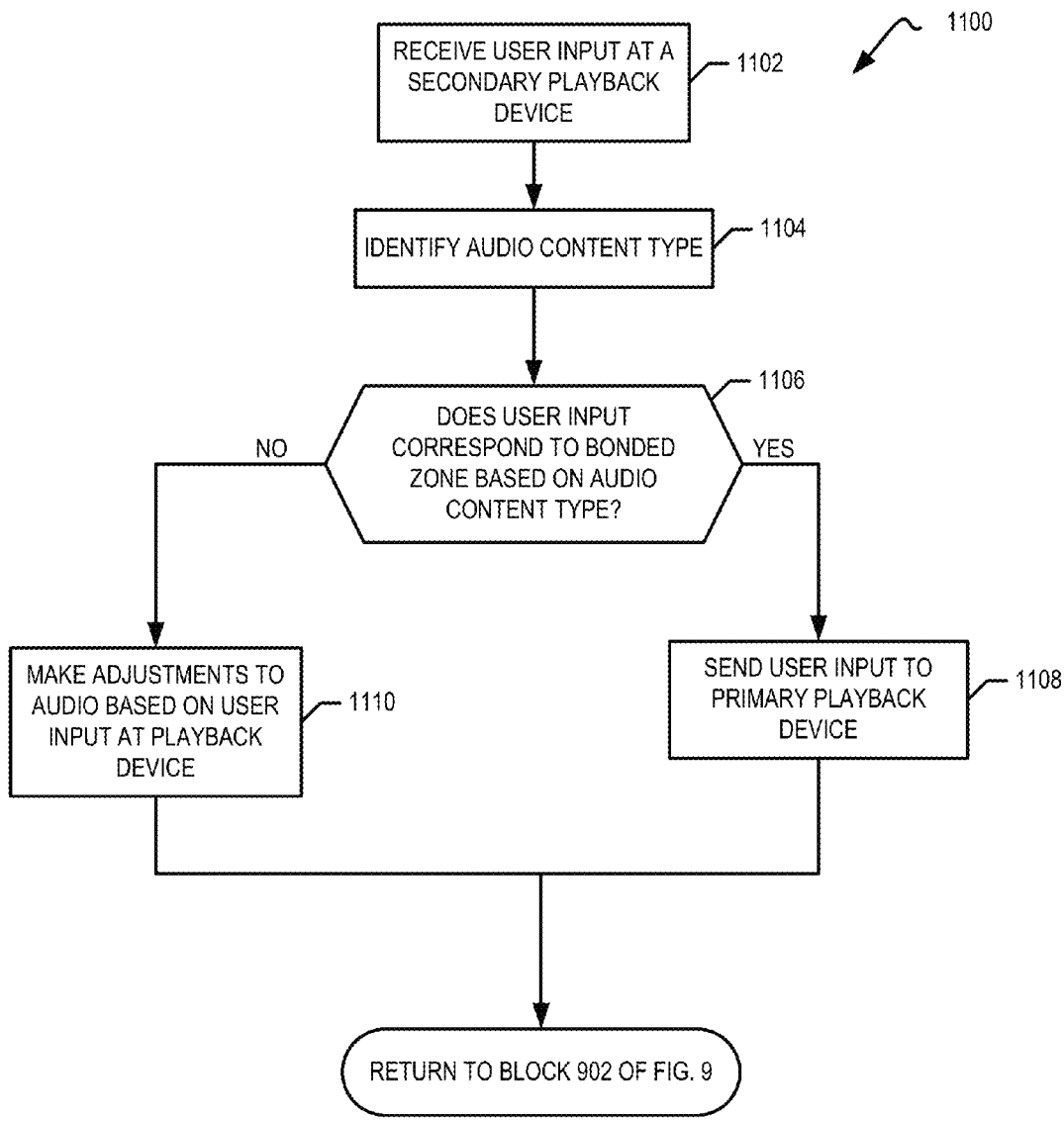
FIG. 11 shows an illustrative flowchart for another example method for volume control a bonded zone.

FIG. 11 shows an illustrative flowchart for another example method 1100 for volume control in a bonded zone. The example method 1100 begins at block 1102 when a secondary playback device receives user input while the bonded zone is in playback mode. For example, the secondary playback device may receive user input via a user interface included or associated with the secondary playback device. At block 1104, the secondary playback device identifies an audio content type. For example, the audio may be surround sound audio (e.g., television audio), 2-channel audio (e.g., music such as streaming music over the Internet), etc. In some examples, the audio content type may be determined based on information included in (or with) the content or stream, such as metadata, headers and/or tags. In some examples, the audio content type may be determined based on device inputs. For example, content played or accessed via the network interface may be assumed to be 2-channel stereo while content played or accessed over an Optical Line may be assumed to be a 5.1 sound system.

At block 1106, a determination is made whether the user input corresponds to the bonded zone based on the audio content type. For example, user input to increase the volume during playback of surround sound audio corresponds to the bonded zone. As a result, at block 1108, the secondary playback device generates and sends an information packet with the user input to the primary playback device. Control may then proceed to block 902 of FIG. 9 to receive user input.

In some examples, at block 1106, the user input may not correspond to the bonded zone based on the audio content type. For example, user input to increase the volume during playback of 2-channel audio may be processed by the secondary playback device. In some examples, the user input may correspond to a portion of the bonded zone. Control may then proceed to block 902 of FIG. 9 to receive user input.

Figure 12:
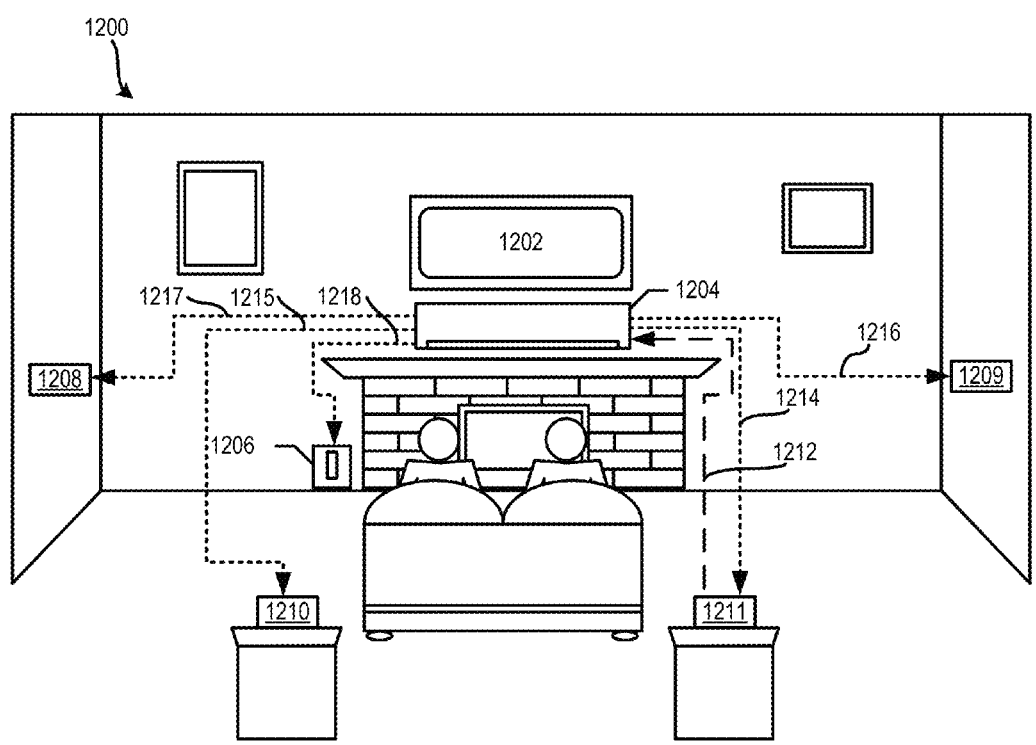
FIG. 12 shows an illustrative flow path for satellite volume control in an example environment.

FIG. 12 shows an illustrative flow path for satellite volume control in an example environment 1200. The example environment 1200 includes a television 1202 and a bonded zone including a primary playback device 1204 and secondary playback devices 1206, 1208, 1209, 1210 and 1211. In some embodiments, primary playback device 1204 is a sound bar (e.g., a SONOS® PLAYBAR™), secondary playback device 1206 is a subwoofer (e.g., a SONOS® SUB™), and secondary playback devices 1208-1211 are full frequency spectrum playback devices (e.g., a SONOS® PLAY:3™, a SONOS® PLAY:5™, etc.). For the purposes of the following example, the playback device 1204 is referred to as the sound bar 1204. While the sound bar 1204 is designated the primary playback device in the illustrated example, any of the playback devices 1204, 1206, 1208-1211 may be designated a primary playback device (with the sound bar 1204 as a secondary playback device). In some examples, environment 1200 may include more or fewer playback devices and/or media presentation devices such as the television 1202.

In the illustrated example of FIG. 12, a user initiates satellite volume control by selecting a volume change at the playback device 1211. For example, a user may select a "volume up" button included or otherwise associated with the playback device 1211. In the illustrated example, the volume change corresponds to an increment (e.g., a delta) rather than a scale number (e.g., a volume of "1," "5," "10," etc.). For example, the increment may be "+2," "+5," "up," etc.

In the illustrated example, an information packet 1212 including the user input (e.g., volume change) is transmitted from the playback device 1211 to the sound bar 1204. For example, the playback device 1211 may generate an information packet including the user input to send to the sound bar 1204. In some examples, the playback device 1211 may send an information packet for each selection by the user. That is, if the user selects the "volume up" button three times, then the playback device 1211 generates and sends three information packets to the sound bar 1204 for processing. In some examples, the playback device 1211 may collect user inputs for a short period and send the collected user inputs in an information packet. For example, a collection period may be initiated in response to the first selection of the "volume up" button. In some such examples, the playback device 1211 aggregates selections made by the user before the collection period expires into an information packet to send to the sound bar 1204. For example, if a user selects the "volume up" button three times in succession before a collection period, initiated after the first selection was received, expires, the playback device 1211 generates an information packet indicating the user desires to increase the volume at three increment levels (e.g., "+6," "15," "up, up, up," etc.).

In the illustrated example of FIG. 12, a volume modifier included in the sound bar 1204 (e.g., the example volume modifier 424 of FIG. 4) processes the user input included in the information packet 1212. In the illustrated example, the playback devices 1204, 1206, 1208-1211 of the bonded zone are in playback mode and are playing audio associated with media being presented via the television 1204 (e.g., a movie, a television show, etc.). Accordingly, the volume modifier of the sound bar 1204 processes and transmits adjusted audio for playback by each of the playback devices. For example, the sound bar 1204 sends right-rear audio channel of the full spectrum audio 1214 to the playback device 1211, sends left-rear audio channel of the full spectrum audio 1215 to the playback device 1210, sends right-front audio channel of the full spectrum audio 1216 to the playback device 1209, sends left-front audio channel of the full spectrum audio 1217 to the playback device 1208 and sends low frequency audio spectrum 1218 to the subwoofer 1206.

Figure 13:
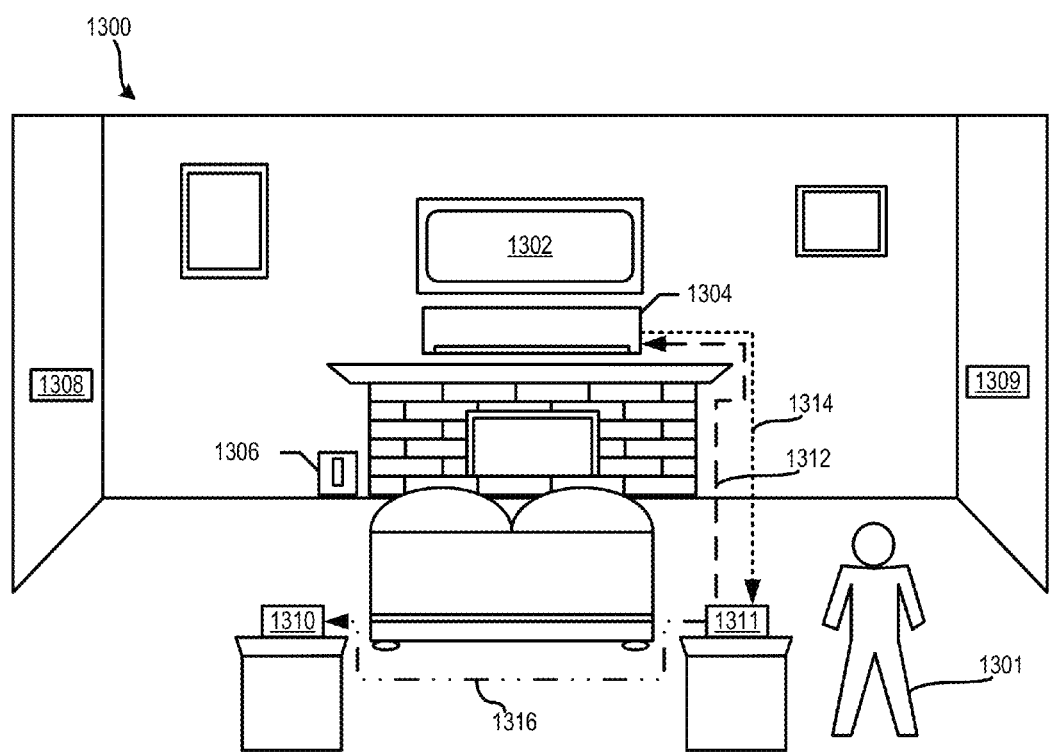
FIG. 13 shows another illustrative flow path for satellite volume control in an example environment.

FIG. 13 shows an illustrative flow path for satellite volume control in an example environment 1300. The example environment 1300 includes a television 1302 and a bonded zone including a primary playback device 1304 (e.g., a sound bar) and secondary playback devices 1306, 1308, 1309, 1310 and 1311. In addition to the bonded zone of the environment 1300, the playback devices 1308, 1309 are paired playback devices. In the illustrated example of FIG. 13, the bonded zone is not playing audio (e.g., in a paused playback mode, a stopped playback mode, etc.). For the purposes of the following example illustrated in FIG. 13, the playback device 1304 is referred to as the sound bar 1304.

In the illustrated example of FIG. 13, a user 1301 initiates the satellite volume control by selecting a volume change (e.g., a decrease in volume) at the playback device 1311. The playback device 1311 transmits information packet 1312 including the user input to the sound bar 1304. In the illustrated example, the sound bar 1304 processes the information packet 1312 and sends audio data 1314, based on the information packet 1312, back to the playback device 1311. Playback device 1311 then sends audio data 1316 to its paired playback device (e.g., the playback device 1310). In some embodiments, the sound bar 1304 may send audio data 1314 to both paired playback devices 1310, 1311.

In some embodiments, paired playback devices in a bonded zone may include a primary playback device of the paired playback devices, resulting in a hierarchy of playback devices. For example, the playback device 1310 may be a primary playback device for the paired playback devices 1310, 1311. However, the bonded zone also includes a primary playback device (e.g., the sound bar 1304). In some such examples, the bonded zone primary playback device may send audio data to the paired primary playback device, which then adjusts and transmits audio data to the paired secondary playback device. For example, the playback device 1311 may send information packet 1312 to the sound bar 1304. As a result, the sound bar 1304 sends audio data 1314 to the playback device 1310, which sends audio data 1316 to the playback device 1311.

Figure 14:
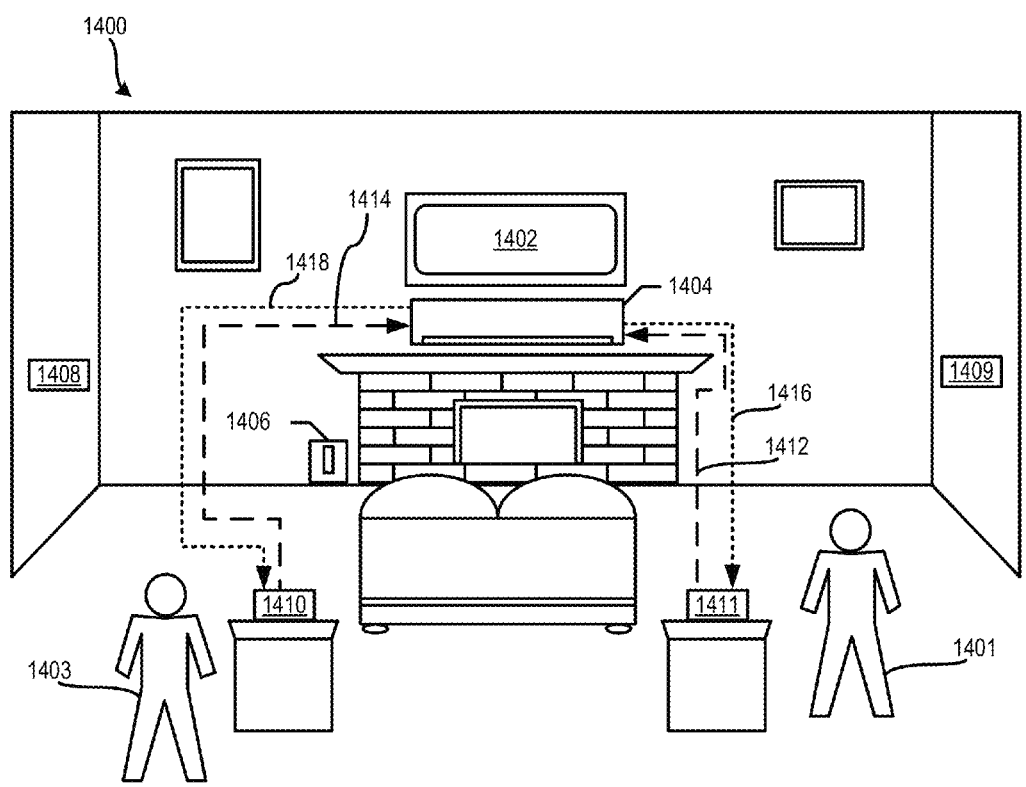
FIG. 14 shows another illustrative flow path for satellite volume control in an example environment.

FIG. 14 shows an illustrative flow path for satellite volume control in an example environment 1400. The example environment 1400 includes a television 1402 and a bonded zone including a primary playback device 1404 (e.g., a sound bar) and secondary playback devices 1406, 1408, 1409, 1410 and 1411. For the purposes of the following example illustrated in FIG. 14, the playback device 1404 is referred to as the sound bar 1404. In the illustrated example, multiple users select volume changes on different secondary playback devices at the same time (or at nearly the same time). For example, a first user 1401 selects the "volume up" button included or otherwise associated with the playback device 1411 three times. Accordingly, the playback device 1411 sends an information packet 1412 including the three user inputs to the sound bar 1404. At the same time (or nearly the same time), a second user 1403 selects the "volume up" button included or otherwise associated with the playback device 1410. Accordingly, the playback device 1410 sends an information packet 1414 including the user input to the sound bar 1404.

In some embodiments, the sound bar 1404 processes each information packet received. For example, the sound bar 1404 adjusts (e.g., increases) the bond zone audio volume in environment 1400 four increment levels (e.g., "+8," "+20," "up, up, up, up," etc.). The sound bar 1404 may send a first four increment level audio 1416 to the playback device 1411 and a second four increment level audio 1418 to the playback device 1410, respectively. As a result, the audio volume for the bonded zone sounds the same as if the "volume up" button had been selected four times on either playback device 1410, 1411.

In some embodiments, if the sound bar 1404 receives multiple information packets within a period, the sound bar 1404 may discard one or more of the information packets. For example, when the information packets 1412, 1414 are received by the sound bar 1404 at the same time (or at nearly the same time), the sound bar 1404 may discard information packet 1414 and adjust (e.g., increase) the bond zone audio volume in environment 1400 three increment levels. In some embodiments, the sound bar 1404 selects the first information packet received during the period and discards any other information packets received during the period. In some embodiments, the sound bar 1404 randomly selects an information packet received during the period to process.

IX. Conclusion

The descriptions above disclose various example systems, methods, apparatus, and articles of manufacture including, among other components, firmware and/or software executed on hardware. However, such examples are merely illustrative and should not be considered as limiting. For example, it is contemplated that any or all of these firmware, hardware, and/or software components can be embodied exclusively in hardware, exclusively in software, exclusively in firmware, or in any combination of hardware, software, and/or firmware. Accordingly, while the following describes example systems, methods, apparatus, and/or articles of manufacture, the examples provided are not the only way(s) to implement such systems, methods, apparatus, and/or articles of manufacture.

As suggested above, the present application involves satellite volume control. In one aspect, a method is provided. The method includes receiving an input at a playback device to adjust a volume for a plurality of playback devices that are grouped for synchronous playback of audio content, wherein the plurality of playback devices includes the playback device. The method also includes sending a first message over a network from the playback device to a device associated with the plurality of playback devices, the first message including information based on the input, wherein the information is used to adjust the volume of the plurality of playback devices. The method also includes receiving a second message at the playback device over the network, the second message including information for the volume of the playback device, wherein the volume is based on the adjusted volume of the plurality of playback devices.

In another aspect, a system is provided. The system includes a plurality of playback devices that are grouped for synchronous playback of audio content and a processor configured to execute instructions. The instructions are executable to cause the processor to receive an input at a playback device to adjust a volume for the plurality of playback devices, wherein the plurality of playback devices includes the playback device. The instructions to also cause the processor to send a first message over a network from the playback device to a device associated with the plurality of playback devices, the first message to include information based on the input, wherein the information is used to adjust the volume of the plurality of playback devices. The instructions to also cause the processor to receive a second message at the playback device over the network, the second message to include information for the volume of the playback device, wherein the volume is based on the adjusted volume of the plurality of playback devices.

In a further aspect, a non-transitory computer readable medium having instructions stored thereon is provided. The instructions are executable by a computing device to cause the computing device to perform functions including receiving an input at a playback device to adjust a volume for a plurality of playback devices that are grouped for synchronous playback of audio content. The instructions to also cause the computing device to perform functions including sending a first message over a network from the playback device to a device associated with the plurality of playback devices, the first message including information based on the input, wherein the information is used to adjust the volume of the plurality of playback devices. The instructions to also cause the computing device to perform functions including receiving a second message at the playback device over the network, the second message including information for the volume of the playback device, wherein the volume is based on the adjusted volume of the plurality of playback devices.

Additionally, references herein to "embodiment" means that a particular feature, structure, or characteristic described in connection with the embodiment can be included in at least one example embodiment of the invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

The example processes of FIGS. 9-11 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals. As used herein, "tangible computer readable storage medium" and "tangible machine readable storage medium" are used interchangeably. Additionally or alternatively, the example processes of FIGS. 9-11 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable device or disc and to exclude propagating signals. As used herein, when the phrase "at least" is used as the transition term in a preamble of a claim, it is open-ended in the same manner as the term "comprising" is open ended.

When any of the appended claims are read to cover a purely software and/or firmware implementation, at least one of the elements in at least one example is hereby expressly defined to include a tangible medium such as a memory, DVD, CD, Blu-ray, and so on, storing the software and/or firmware.

We claim:

1. A method comprising:
   receiving, at a first playback device having a first volume level, an input to adjust a volume for a plurality of playback devices that are grouped for synchronous playback of audio content comprising a set of channels, wherein the plurality of playback devices are grouped such that each of the plurality of playback devices is configured to play different channels of the set of channels, wherein the plurality of playback devices includes the first playback device;
   determining, at the first playback device, that the first playback device is configured to play at least a first channel of the set of channels different from channels of other playback devices of the plurality of playback devices;
   responsive to determining that the first playback device is configured to play at least the first channel, sending, while the first playback device has the first volume level, a first message over a network from the first playback device to a primary device associated with the plurality of playback devices, the first message including volume adjustment information for the plurality of playback devices based on the input;
   after sending the first message, receiving a second message at the first playback device over the network, the second message including information for controlling the volume of the first playback device; and
   based on the received second message, adjusting the first volume level of the first playback device to a second volume level, wherein the second volume level of the first playback device is based on the information for controlling the volume of the first playback device included in the second message.

2. The method of claim 1, wherein receiving the input comprises receiving a user input via an interface on the first playback device.

3. The method of claim 1, wherein the information for controlling the volume of the first playback device comprises volume adjusted audio content.

4. The method of claim 1, wherein the information for controlling the volume of the first playback device comprises a gain value, and wherein the first playback device uses the gain value in the playback of audio content.

5. The method of claim 1, wherein the volume of the plurality of playback devices is based on a volume of each playback device in the plurality of playback devices.

6. The method of claim 1, wherein based on the adjusted volume of the plurality of playback devices, the second volume level of the first playback device is different than a volume level of another playback device in the plurality of playback devices.

7. A system comprising:
   a plurality of playback devices that are grouped for synchronous playback of audio content comprising a set of channels, wherein the plurality of playback devices are grouped such that each of the plurality of playback devices is configured to play different channels of the set of channels, wherein the plurality of playback devices includes the first playback device;
   one or more processors; and
   memory storing instructions, that when executed by the one or more processors, cause the system to:
   receive, at the first playback device having a first volume level, an input to adjust a volume for the plurality of playback devices;

determine, at the first playback device, that the first playback device is configured to play at least a first channel of the set of channels different from channels of other playback devices of the plurality of playback devices;

responsive to determining that the first playback device is configured to play at least the first channel, send a first message over a network from the first playback device to a primary device associated with the plurality of playback devices, the first message to include volume adjustment information for the plurality of playback devices based on the input, and wherein the first playback device remains at the first volume level;

after sending the first message, receive a second message at the first playback device over the network, the second message to include information for controlling the volume of the first playback device; and based on the received second message, adjust the first volume level of the first playback device to a second volume level, wherein the second volume level of the first playback device is based on the information for controlling the volume of the first playback device included in the second message.

8. The system of claim 7, wherein receiving the input further comprises instructions that are to cause the processor to receive a user input via an interface on the first playback device.

9. The system of claim 7, wherein the information for controlling the volume of the first playback device is to comprise volume adjusted audio content.

10. The system of claim 7, wherein the information for controlling the volume of the first playback device comprises a gain value, and wherein the instructions further cause the one or more processors to use the gain value in the playback of audio content at the first playback device.

11. The system of claim 7, wherein the volume of the plurality of playback devices is based on a volume of each playback device in the plurality of playback devices.

12. A non-transitory computer-readable storage medium having stored thereon instructions executable by a computing device to cause the computing device to perform functions comprising:

receiving, at a first playback device having a first volume level, an input to adjust a volume for a plurality of playback devices that are grouped for synchronous playback of audio content comprising a set of channels, wherein the plurality of playback devices are grouped such that each of the plurality of playback devices is configured to play different channels of the set of channels, wherein the plurality of playback devices includes the first playback device;

determining, at the first playback device, that the first playback device is configured to play at least a first channel of the set of channels different from channels of other playback devices of the plurality of playback devices;

responsive to determining that the first playback device is configured to play at least the first channel, sending a first message over a network from the first playback device to a primary device associated with the plurality of playback devices, the first message including volume adjustment information for the plurality of playback devices based on the input, and wherein the first playback device remains at the first volume level;

after sending the first message, receiving a second message at the first playback device over the network, the second message including information for controlling the volume of the first playback device; and based on the received second message, adjusting the first volume level of the first playback device to a second volume level, wherein the second volume level of the first playback device is based on the information for controlling the volume of the first playback device included in the second message.

13. The non-transitory computer-readable storage medium of claim 12, wherein the volume of the plurality of playback devices is based on a volume of each playback device in the plurality of playback devices.

14. The non-transitory computer-readable storage medium of claim 12, wherein based on the adjusted volume of the plurality of playback devices, the second volume level of the first playback device is different than a volume level of another playback device in the plurality of playback devices.

15. The method of claim 1, wherein determining, at the first playback device, that the first playback device is configured to play the first channel of the set of channels different from the channels of other playback devices of the plurality of playback devices comprises:

determining, at the first playback device, that the first playback device is configured to play the first channel of the set of channels instead of a full range of audio.

16. The method of claim 15, wherein the plurality of devices forms a bonded zone.

17. The method of claim 16, wherein a second plurality of devices forms a zone group of playback devices grouped for synchronous playback of audio content, each of the second plurality of devices being configured to play a full range of audio, and wherein the method further comprises:

receiving, at the first playback device having a third volume level, instructions to leave the bonded zone and join the zone group;

receiving, at the first playback device, a second input to adjust a volume for the zone group;

determining, at the first playback device, that the first playback device is a not a member of the bonded zone; and responsive to determining that the first playback device is not a member of the bonded zone and responsive to the second input, adjusting the third volume level of the first playback device to a fourth volume level.

18. The method of claim 17, further comprising:

after adjusting the first playback device to the fourth volume level, transmitting, to an other playback device of the second plurality of devices, a third message including information for controlling volume of the other playback device of the second plurality of playback devices.

19. The method of claim 1, wherein the first playback device is paired with a second playback device of the plurality of playback devices, and wherein the method further comprises:

determining that the first playback device is paired with the second playback device and that the first playback device is a primary device associated with the pairing with the second playback device; and responsive to receiving the second message, transmitting, to the second playback device, a third message comprising information for controlling the volume of the second playback device.

20. The method of claim 1, wherein the primary device is a second playback device of the plurality of devices.

* * * * *